(12) United States Patent
Ishiduki

(10) Patent No.: US 12,150,301 B2
(45) Date of Patent: Nov. 19, 2024

(54) SEMICONDUCTOR MEMORY DEVICE

(71) Applicant: KIOXIA CORPORATION, Tokyo (JP)

(72) Inventor: Megumi Ishiduki, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/493,933

(22) Filed: Oct. 25, 2023

(65) Prior Publication Data

US 2024/0057330 A1  Feb. 15, 2024

Related U.S. Application Data

(63) Continuation of application No. 17/201,064, filed on Mar. 15, 2021, now Pat. No. 11,839,078.

(30) Foreign Application Priority Data

Sep. 18, 2020  (JP) .................. 2020-157696

(51) Int. Cl.
| | |
|---|---|
| *H10B 43/20* | (2023.01) |
| *H10B 41/10* | (2023.01) |
| *H10B 41/20* | (2023.01) |
| *H10B 41/35* | (2023.01) |
| *H10B 43/10* | (2023.01) |
| *H10B 43/35* | (2023.01) |

(52) U.S. Cl.
CPC .............. *H10B 43/20* (2023.02); *H10B 41/10* (2023.02); *H10B 41/20* (2023.02); *H10B 41/35* (2023.02); *H10B 43/10* (2023.02); *H10B 43/35* (2023.02)

(58) Field of Classification Search
CPC ........ H10B 43/20; H10B 41/10; H10B 41/20; H10B 41/35; H10B 43/10; H10B 43/35; H10B 41/27; H10B 41/50; H10B 43/27; H10B 43/50; H01L 27/11565; H01L 27/11519; H01L 27/11551; H01L 27/11524; H01L 27/11575; H01L 27/11556; H01L 27/1157; H01L 27/11548; H01L 27/11582
See application file for complete search history.

(56) References Cited

U.S. PATENT DOCUMENTS

| | | | | |
|---|---|---|---|---|
| 9,601,370 | B2 | 3/2017 | Kato et al. | |
| 10,707,227 | B2 * | 7/2020 | Yamamoto | ............ H10B 43/40 |
| 10,971,515 | B2 * | 4/2021 | Kobayashi | ............ H01L 23/528 |
| 10,971,516 | B2 * | 4/2021 | Ahn | ...................... H10B 43/50 |

(Continued)

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

According to one embodiment, a semiconductor memory device includes a stacked layer body including conductive layers stacked to be apart from each other in a first direction, and including a stair-like end with rising parts and terrace parts, wherein successive first conductive layers including an uppermost conductive layer function as select gate lines for a NAND string, and a first contact connected to the uppermost conductive layer provided to correspond to a first rising part which is an uppermost one of the rising parts. The first contact passes through the uppermost conductive layer to be further connected to a first conductive layer adjacent to the uppermost conductive layer.

20 Claims, 19 Drawing Sheets

(56) References Cited

U.S. PATENT DOCUMENTS

| | | | |
|---|---|---|---|
| 11,037,948 B2* | 6/2021 | Matsushita | H10B 43/27 |
| 11,075,213 B2* | 7/2021 | Noda | H10B 41/20 |
| 2011/0031546 A1 | 2/2011 | Uenaka et al. | |
| 2016/0093524 A1* | 3/2016 | Izumi | H10B 43/27 |
| | | | 438/637 |
| 2017/0194255 A1 | 7/2017 | Oh | |
| 2017/0263445 A1* | 9/2017 | Soda | H01L 21/4846 |
| 2017/0271256 A1 | 9/2017 | Inatsuka | |
| 2017/0358590 A1 | 12/2017 | Kang et al. | |
| 2018/0197874 A1 | 7/2018 | Oshiki et al. | |
| 2020/0194447 A1* | 6/2020 | Sun | H10B 41/41 |
| 2021/0384354 A1* | 12/2021 | Karda | H01L 29/7869 |

* cited by examiner

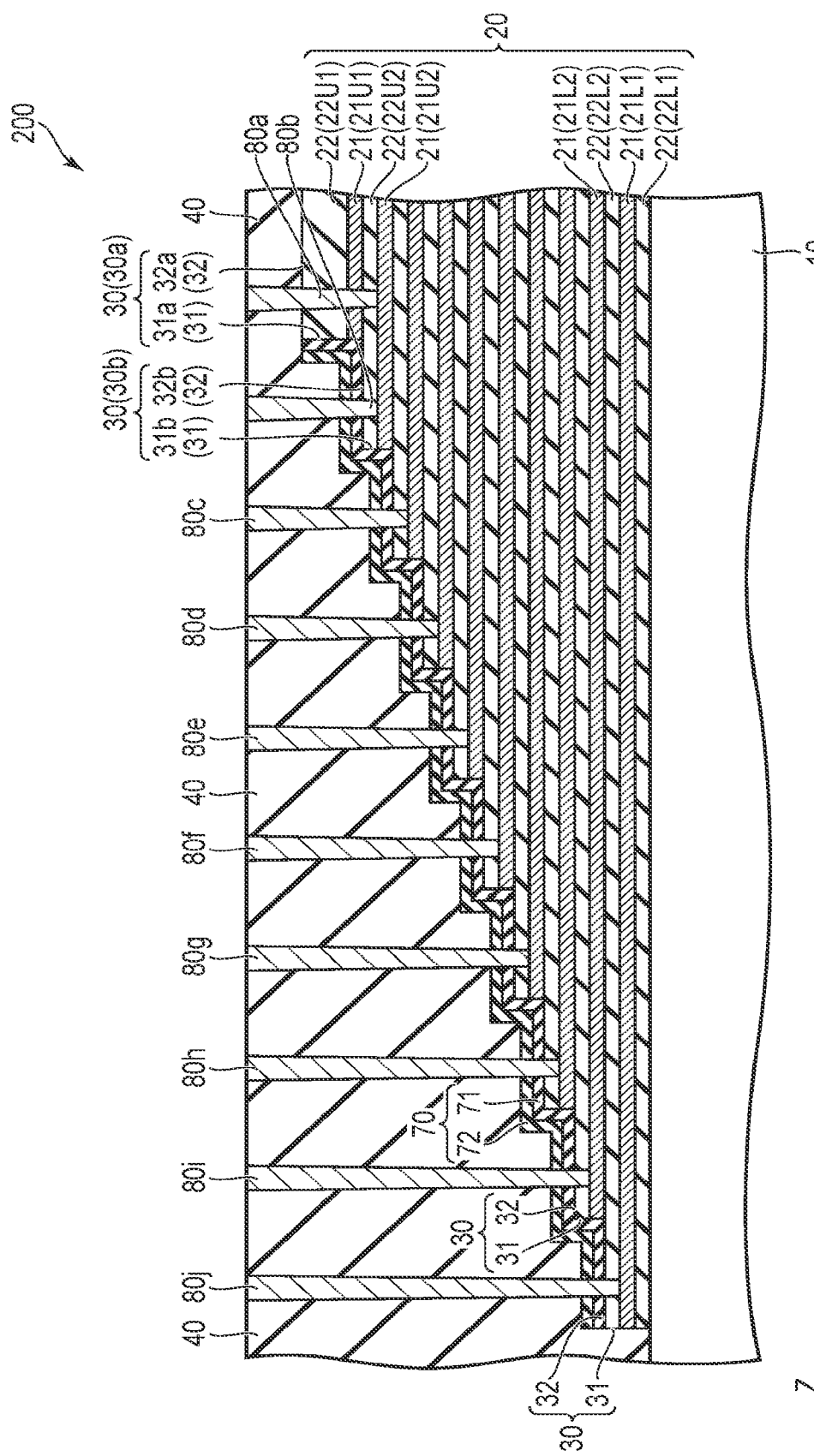
F I G. 2B

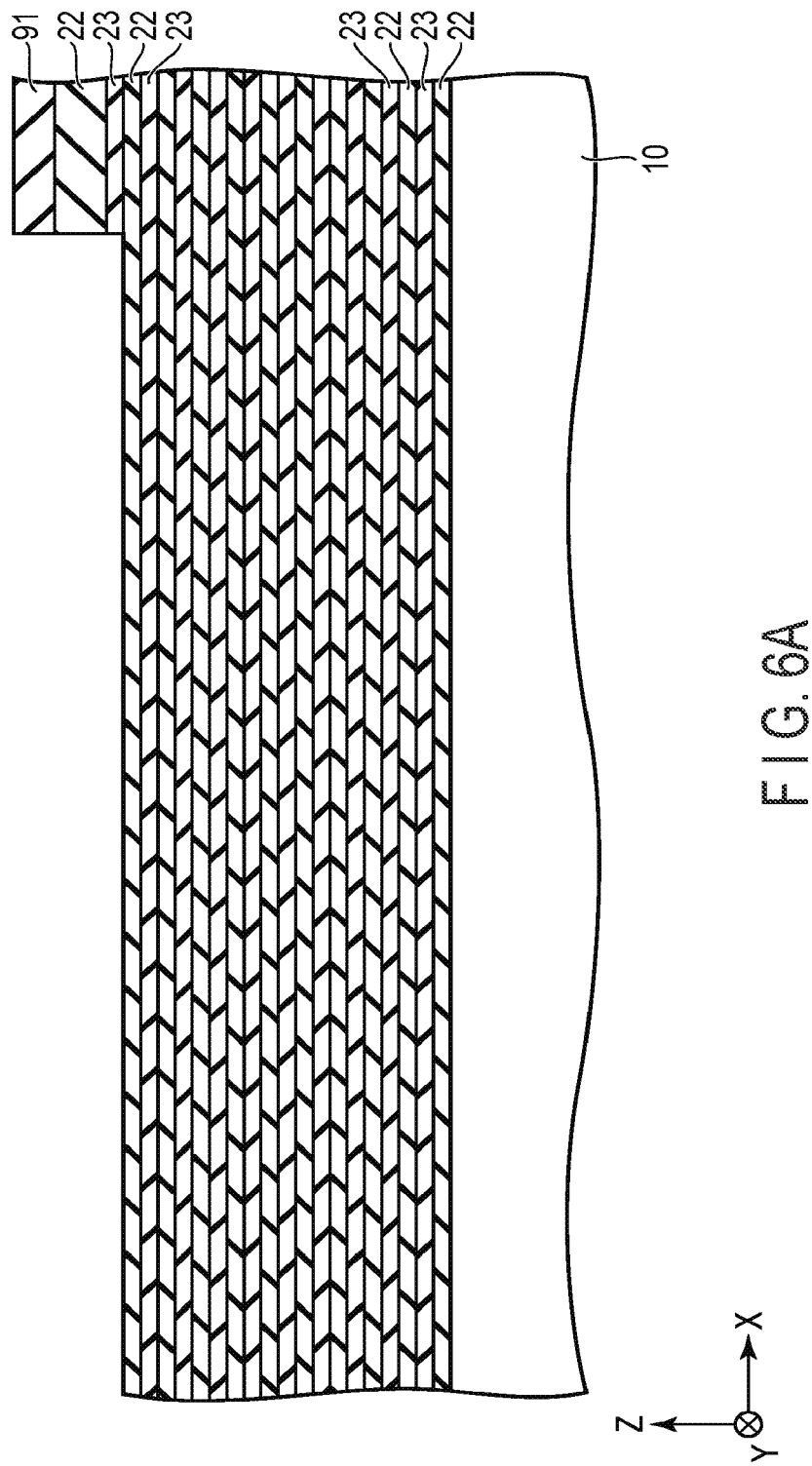
F I G. 6A

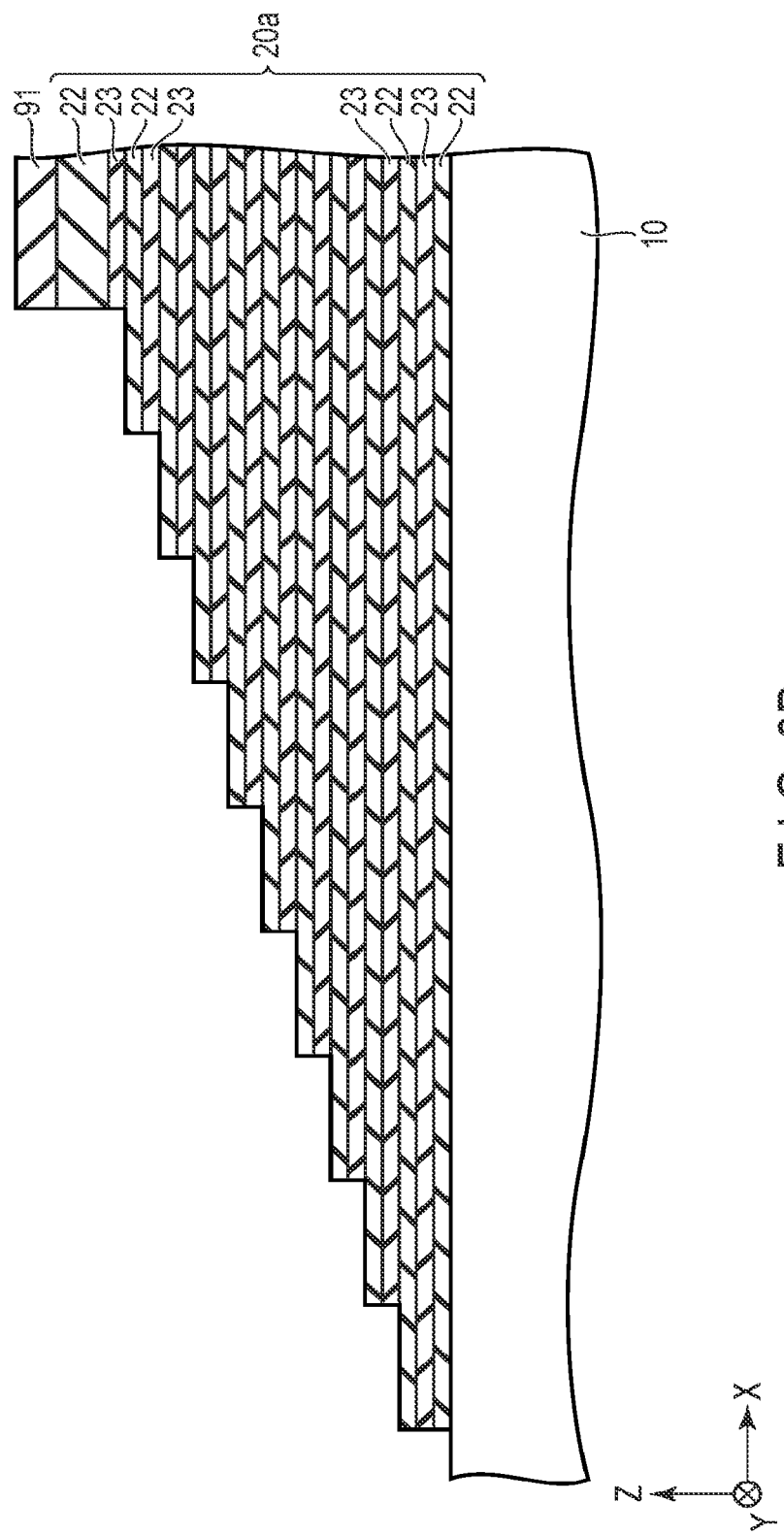
F I G. 6B

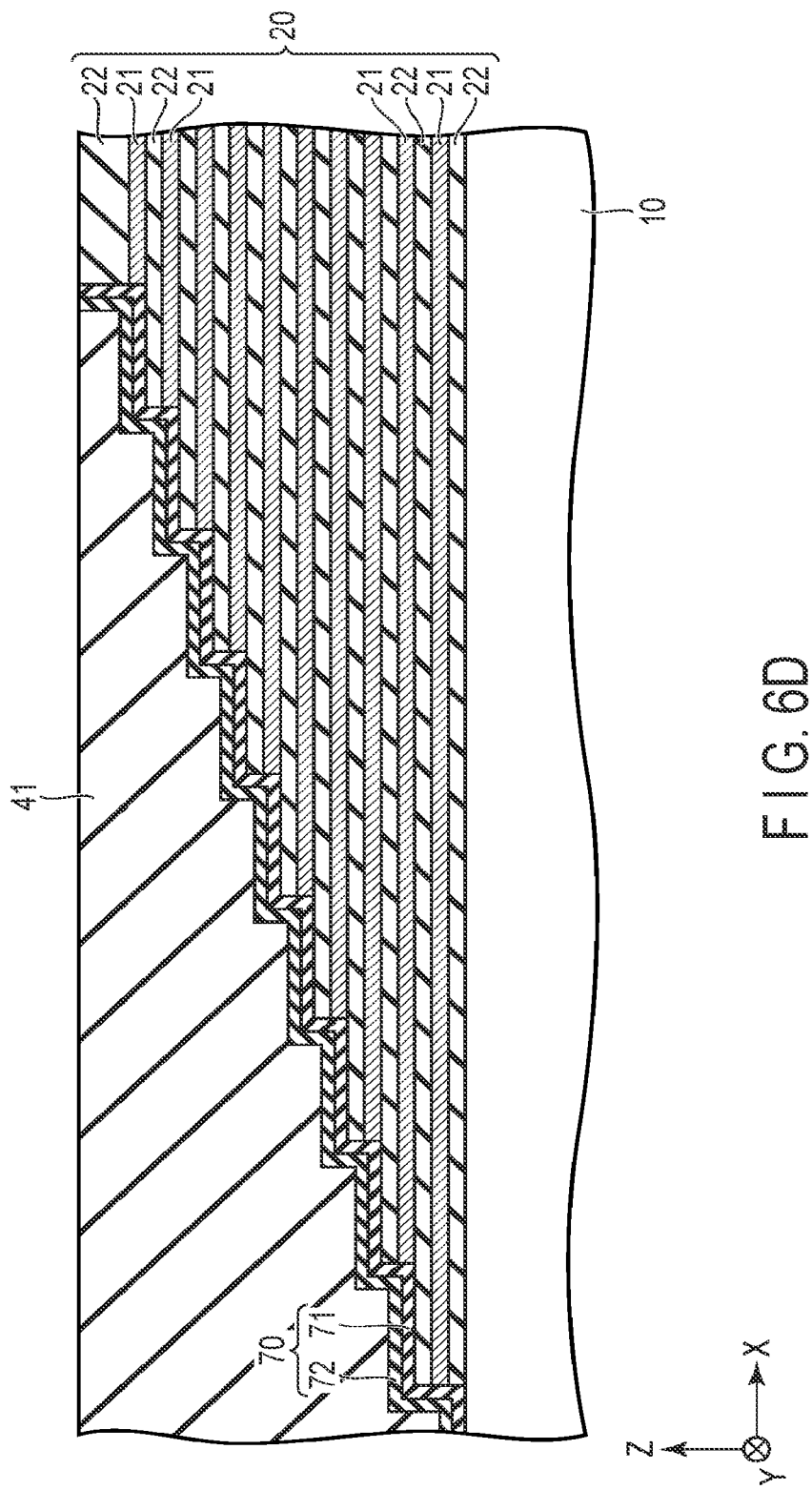
F I G. 6D

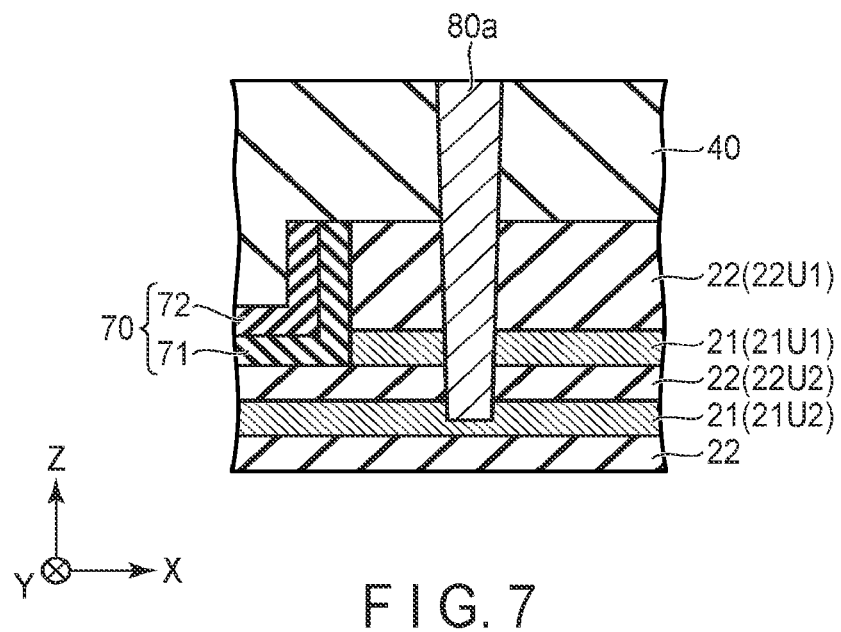
F I G. 7
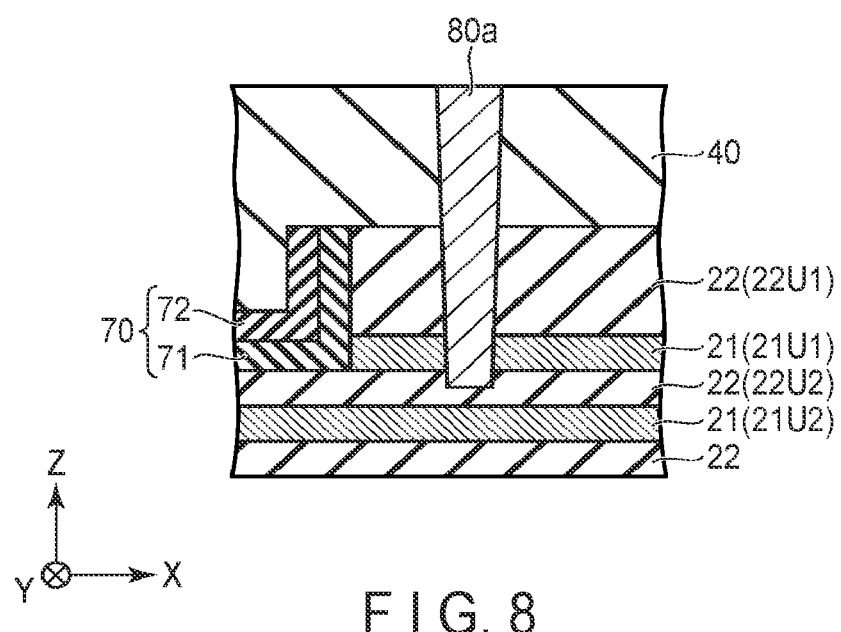
F I G. 8

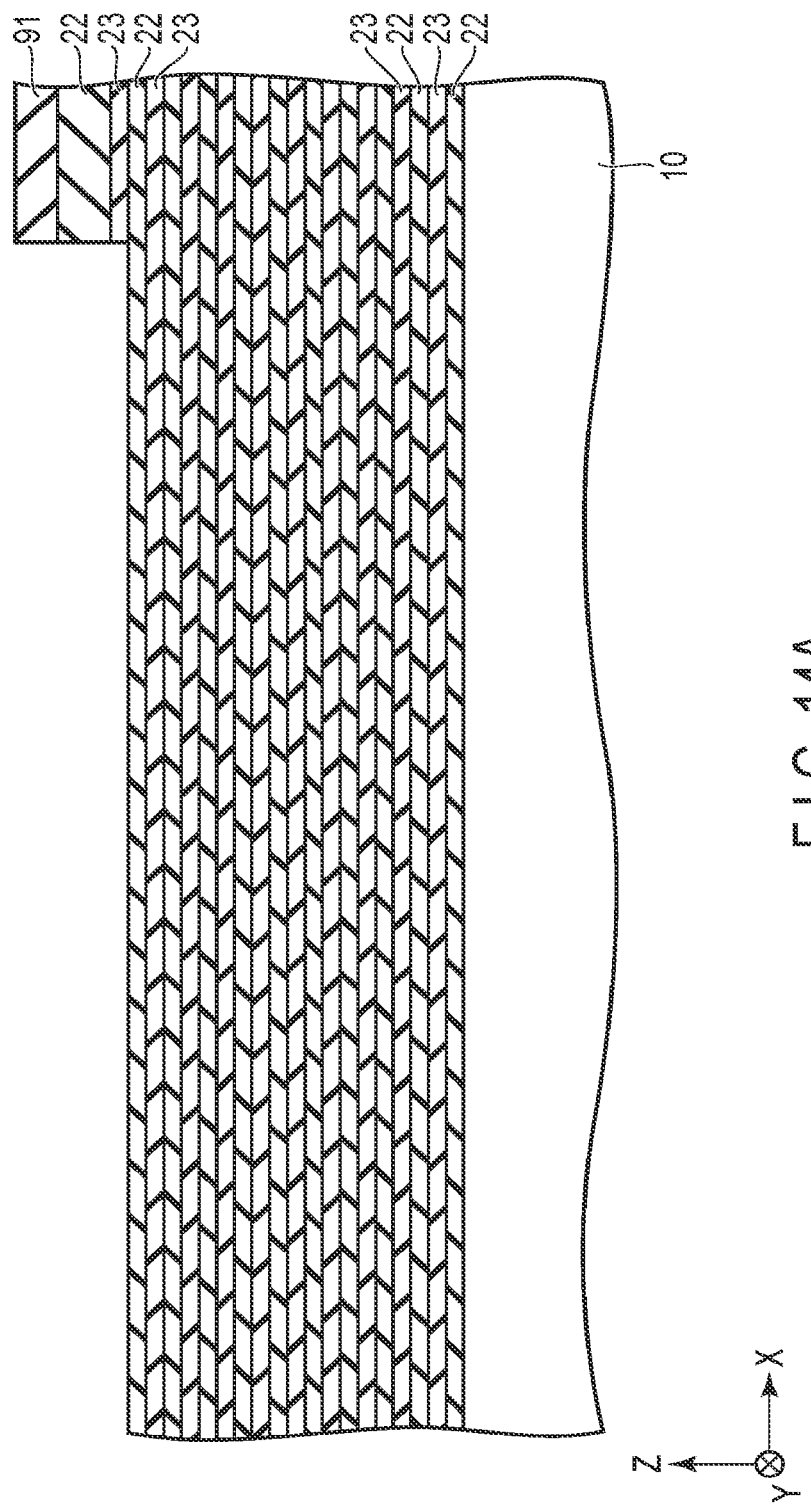
F I G. 14A

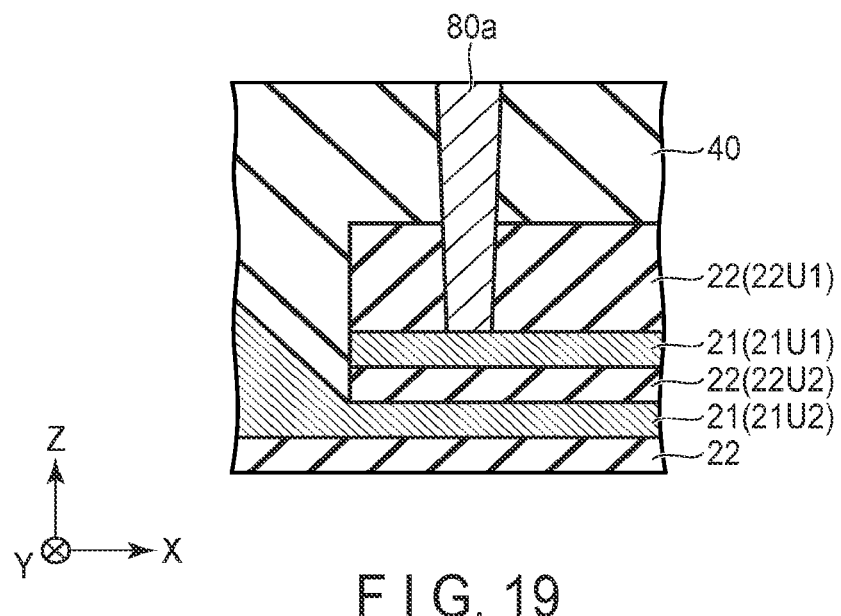
F I G. 19

SEMICONDUCTOR MEMORY DEVICE

CROSS-REFERENCE TO RELATED APPLICATIONS

This application is a continuation of and claims benefit under 35 U.S.C. § 120 to U.S. application Ser. No. 17/201,064, filed Mar. 15, 2021, and is based upon and claims the benefit of priority under 35 U.S.C. § 119 from Japanese Patent Application No. 2020-157696, filed Sep. 18, 2020, the entire contents of each of which are incorporated herein by reference.

FIELD

Embodiments described herein relate generally to a semiconductor memory device.

BACKGROUND

In a three-dimensional nonvolatile memory in which a plurality of memory cells are stacked vertically, when the number of stacked cells increases, an area to provide the contacts connected to the wiring lines extending from the memory cells increases.

BRIEF DESCRIPTION OF THE DRAWINGS

FIG. 2B is a schematic cross-sectional view of the structure of a stairs region of the semiconductor memory device of the first embodiment.

FIG. 6A is a schematic cross-sectional view of a part of a manufacturing method of the semiconductor memory device of the first embodiment.

FIG. 6B is a schematic cross-sectional view of a part of the manufacturing method of the semiconductor memory device of the first embodiment.

FIG. 6D is a schematic cross-sectional view of a part of the manufacturing method of the semiconductor memory device of the first embodiment.

FIG. 7 is a schematic cross-sectional view of a first connection example of a contact and a conductive layer in the semiconductor memory device of the first embodiment.

FIG. 8 is a schematic cross-sectional view of a second connection example of the contact and the conductive layer in the semiconductor memory device of the first embodiment.

FIG. 14A is a schematic cross-sectional view of a part of a manufacturing method of the semiconductor memory device of the second embodiment.

FIG. 19 is a schematic cross-sectional view of a fifth connection example of the contact and the conductive layer in the semiconductor memory device of the second embodiment.

DETAILED DESCRIPTION

In general, according to one embodiment, a semiconductor memory device includes: a stacked layer body including a plurality of conductive layers stacked to be apart from each other in a first direction, and including a stair-like end with a plurality of rising parts and a plurality of terrace parts, wherein a plurality of successive first conductive layers including an uppermost conductive layer of the plurality of conductive layers function as select gate lines for a NAND string, and a plurality of second conductive layers positioned on a lower layer side of the first conductive layers function as word lines for the NAND string; a plurality of pillar structures each including a semiconductor layer extending in the first direction through the stacked layer body; and a first contact connected to the uppermost conductive layer provided to correspond to a first rising part which is an uppermost one of the rising parts, the first contact passing through the uppermost conductive layer to be further connected to a first conductive layer of the plurality of first conductive layers, which is adjacent to the uppermost conductive layer and is provided to correspond to a second rising part positioned on a lower layer side of the first rising part.

Hereinafter, embodiments will be explained with reference to the accompanying drawings.

First Embodiment

Figure 1:
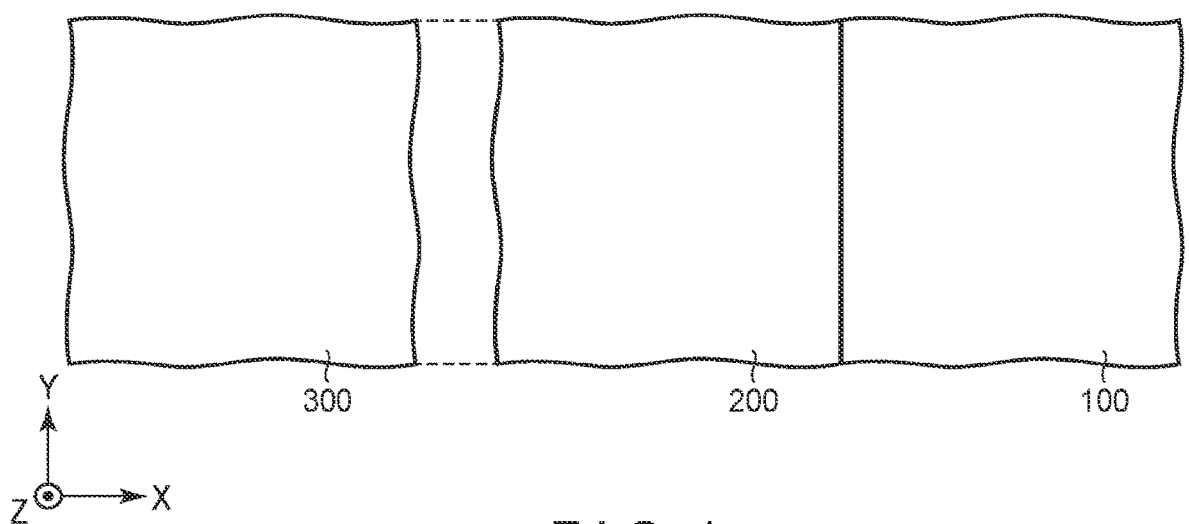
FIG. 1 is a schematic view of an overall arrangement of a semiconductor memory device of a first embodiment.

FIG. 1 is a schematic view of an overall arrangement of a nonvolatile semiconductor memory device of a first embodiment. Note that, in the figures, X, Y, and Z directions are orthogonal to each other.

As shown in FIG. 1, the semiconductor memory device of the present embodiment includes a memory region 100, stairs region 200, and peripheral circuit region 300. The memory region 100, stairs region 200, and peripheral circuit region 300 are disposed on the same semiconductor substrate.

A three-dimensional NAND nonvolatile memory cell array is provided in the memory region 100. Specifically, a NAND string is structured with a plurality of memory cells and a plurality of select transistors arranged in a direction perpendicular to the main surface of the semiconductor substrate (that is, Z direction, or first direction).

The stairs region 200 is adjacent to the memory region 100. As will be described later, a plurality of contacts to supply signals to the memory region 100 are provided in the stairs region 200.

Peripheral circuits for the memory cell array in the memory region 100 are provided in the peripheral circuit region 300.

Figure 2A:
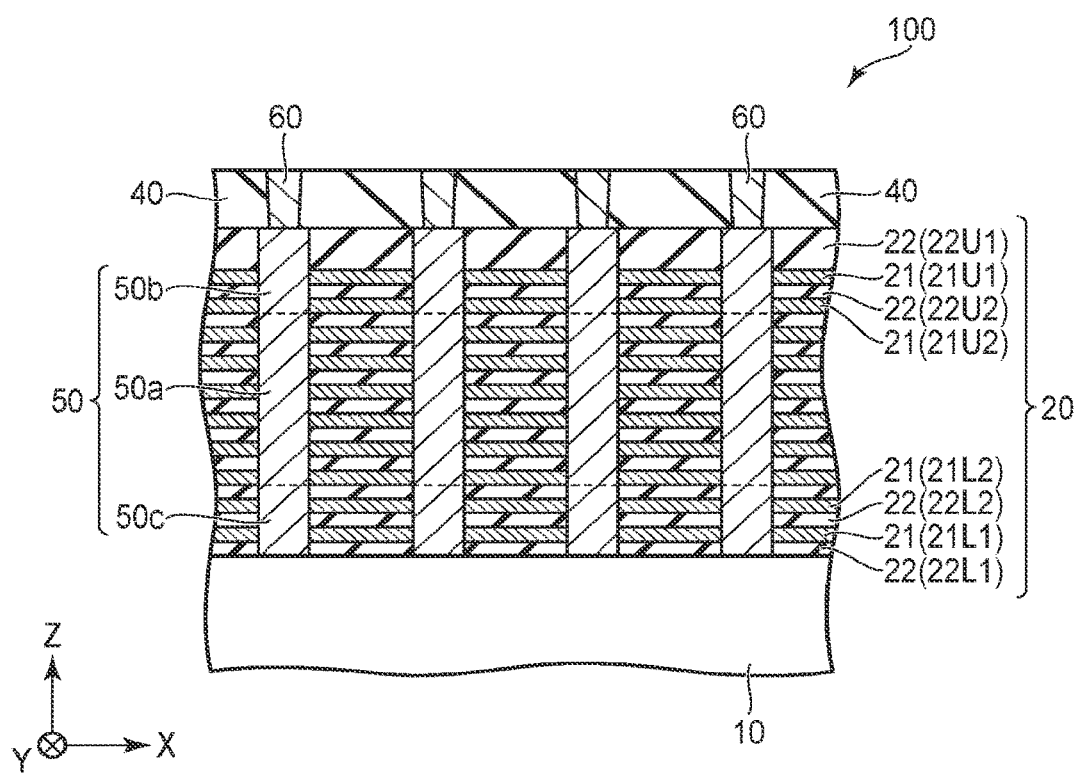
FIG. 2A is a schematic cross-sectional view of the structure of a memory region of the semiconductor memory device of the first embodiment.

FIGS. 2A and 2B are schematic cross-sectional views of the structures of the memory region 100 and the stairs region 200, respectively.

In the memory region 100 and the stairs region 200, a stacked layer body 20 is disposed on a semiconductor substrate 10. The stacked layer body 20 is disposed continuously between the memory region 100 and the stairs region 200.

The stacked layer body 20 has a structure in which a plurality of conductive layers 21 and a plurality of insulating layers 22 are stacked alternately in the Z direction, and has a stair-like end defined by a plurality of steps 30. Note that, one step 30 is defined by a rising part 31 which is substantially parallel to the Z direction and a terrace part (terrace surface) 32 which extends substantially parallel to an X-Y plane (plane perpendicular to the Z direction) from the upper end of the rising part 31. That is, the stacked layer body 20 has a stair-like end including a plurality of rising parts 31 and a plurality of terrace parts 32 (except for the uppermost terrace part 32a). Note that, in the present specification, the direction to which the terrace part (terrace surface) 32 faces will be defined as an upper direction.

The conductive layer 21 functions as a word line or a select gate line, and the insulating layer 22 is to separate and insulate the conductive layers 21. The conductive layer 21 is formed of a metallic material such as tungsten (W), and the insulating layer 22 is formed of an insulating material such as silicon oxide.

An insulating region 40 is adjacent to the stacked layer body 20, and the insulating region 40 covers the stacked layer body 20 including the stair-like end. The insulating region 40 is formed of an insulating material such as silicon oxide.

In the memory region 100, a plurality of pillar structures 50 each extending through the stacked layer body 20 in the Z direction is provided. As will be described later, each pillar structure 50 includes a semiconductor layer extending in the Z direction, and a charge storage layer surrounding a side surface of the semiconductor layer. To each pillar structure 50, a contact 60 passing through the insulating region 40 is connected.

The pillar structure 50 is surrounded by a plurality of conductive layers 21 and a plurality of insulating layers 22. A NAND string is structured with the pillar structure 50 and the conductive layers 21 surrounding the pillar structure 50.

The NAND string includes a plurality of memory cells connected in series, two or more upper select transistors (drain side select transistors) disposed on the upper layer side of the memory cells and connected to the memory cells in series, and one or more lower select transistors (source side select transistors) disposed on the lower layer side of the memory cells and connected to the memory cells in series.

In the example depicted, a first part 50a of the pillar structure 50 and the conductive layers 21 surrounding the first part 50a constitute a plurality of memory cell transistors (memory cells) connected in series, and a channel of the memory cell transistor is formed in the first part 50a of the pillar structure 50. Furthermore, a second part 50b positioned on the upper layer side of the first part 50a of the pillar structure 50 and an uppermost conductive layer 21U1 and second conductive layer 21U2 adjacent to the uppermost conductive layer 21U1 in the Z direction constitute two upper select transistors which select the memory cells connected in series, and a channel of the upper select transistor is formed in the second part 50b of the pillar structure 50. Furthermore, a third part 50c positioned on the lower layer side of the first part 50a of the pillar structure 50 and a lowermost conductive layer 21L1 and second conductive layer 21L2 adjacent to the lowermost conductive layer 21L1 in the Z direction constitute two lower select transistors which select the memory cells connected in series, and a channel of the lower select transistor is formed in the third part 50c of the pillar structure 50.

As can be understood from the above, in the present embodiment, the uppermost conductive layer 21U1 functions as a select gate line (upper select gate line) for the uppermost upper select transistor. The second conductive layer 21U2 adjacent to the uppermost conductive layer 21U1 in the Z direction functions as a select gate line for the second upper select transistor from the uppermost layer. The select gate lines for the above two upper select transistors are controlled commonly.

Similarly, the lowermost conductive layer 21L1 functions as a select gate line (lower select gate line) for the lowermost lower select transistor, and the second conductive layer 21L2 adjacent to the lowermost conductive layer 21L1 in the Z direction functions as a select gate line for the second lower select transistor from the lowermost layer. The select gate lines for the above two lower select transistors are controlled commonly.

Furthermore, the conductive layers 21 from the third conductive layer 21 from the top which is adjacent to the second conductive layer 21U2 to the third conductive layer 21 from the bottom which is adjacent to the second conductive layer 21L2 function as the word lines for the memory cell transistors.

Note that, in the example depicted, one NAND string includes six memory cells, two upper select transistors, and two lower select transistors; however, in reality, one NAND string includes many memory cells. Furthermore, as described above, the number of upper select transistors is two or more while the number of the lower select transistors is one or more.

To generalize the above-described points with respect to the conductive layers 21, it is noted that the successive first conductive layers 21 including the uppermost conductive layer 21U1 function as upper select gate lines for the NAND string, second conductive layers 21 positioned on the lower layer side of the first conductive layers 21 function as word lines for the NAND string, and at least one third conductive layer 21 positioned on the further lower layer side of the second conductive layers 21 and including the lowermost conductive layer 21L1 functions as a lower select gate line for the NAND string.

Figure 3:
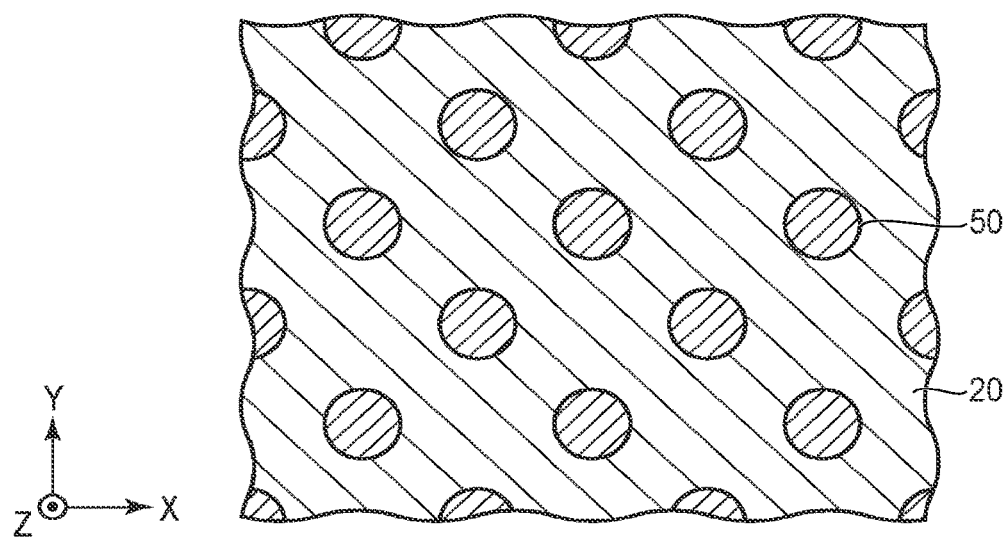
FIG. 3 is a schematic plan view of an example of the arrangement of the pillar structure included in the memory region of the semiconductor memory device of the first embodiment.

FIG. 3 is a schematic plan view illustrating an example of the arrangement of the pillar structure 50 included in the memory region 100. As shown in FIG. 3, a plurality of pillar structures 50 are arranged parallel to the X-Y plane, and each pillar structure 50 is surrounded by the stacked layer body 20.

Figure 4:
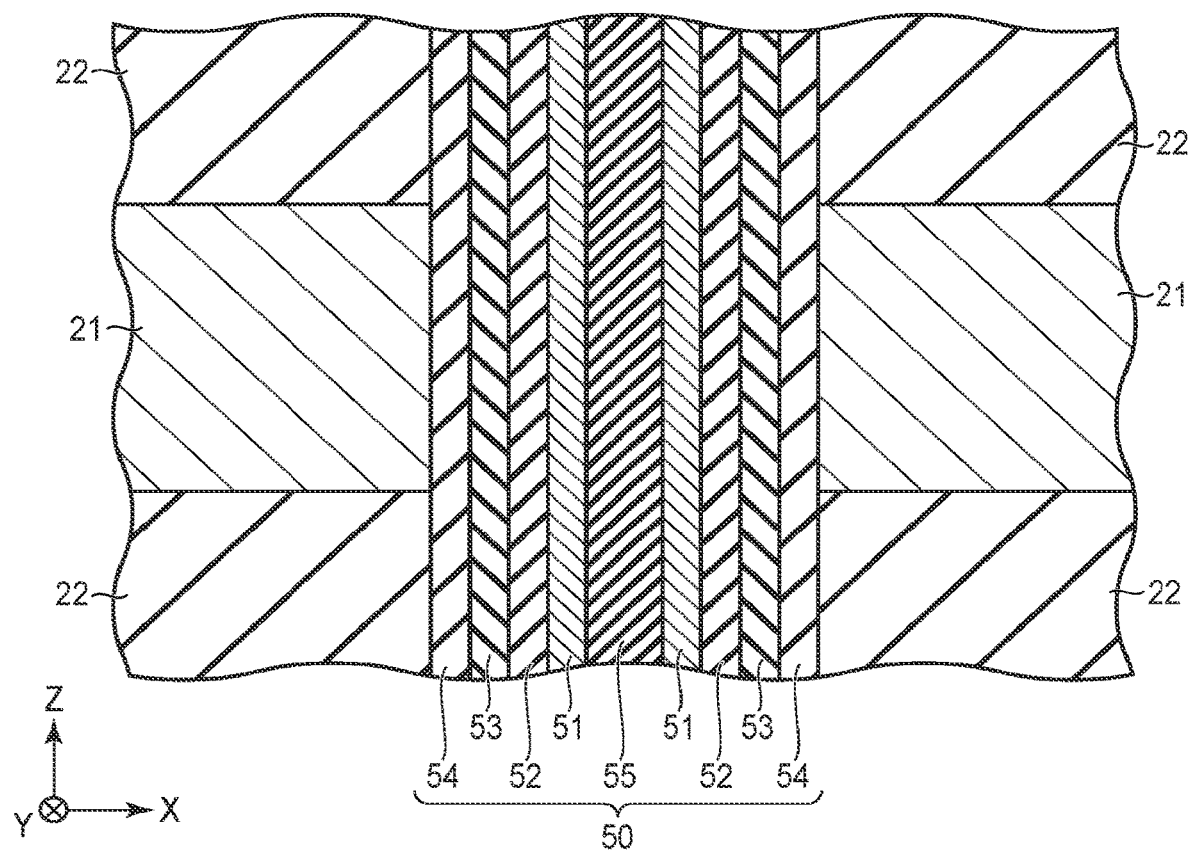
FIG. 4 is a schematic cross-sectional view of the detailed structure of a memory cell part of the semiconductor memory device of the first embodiment.
Figure 5:
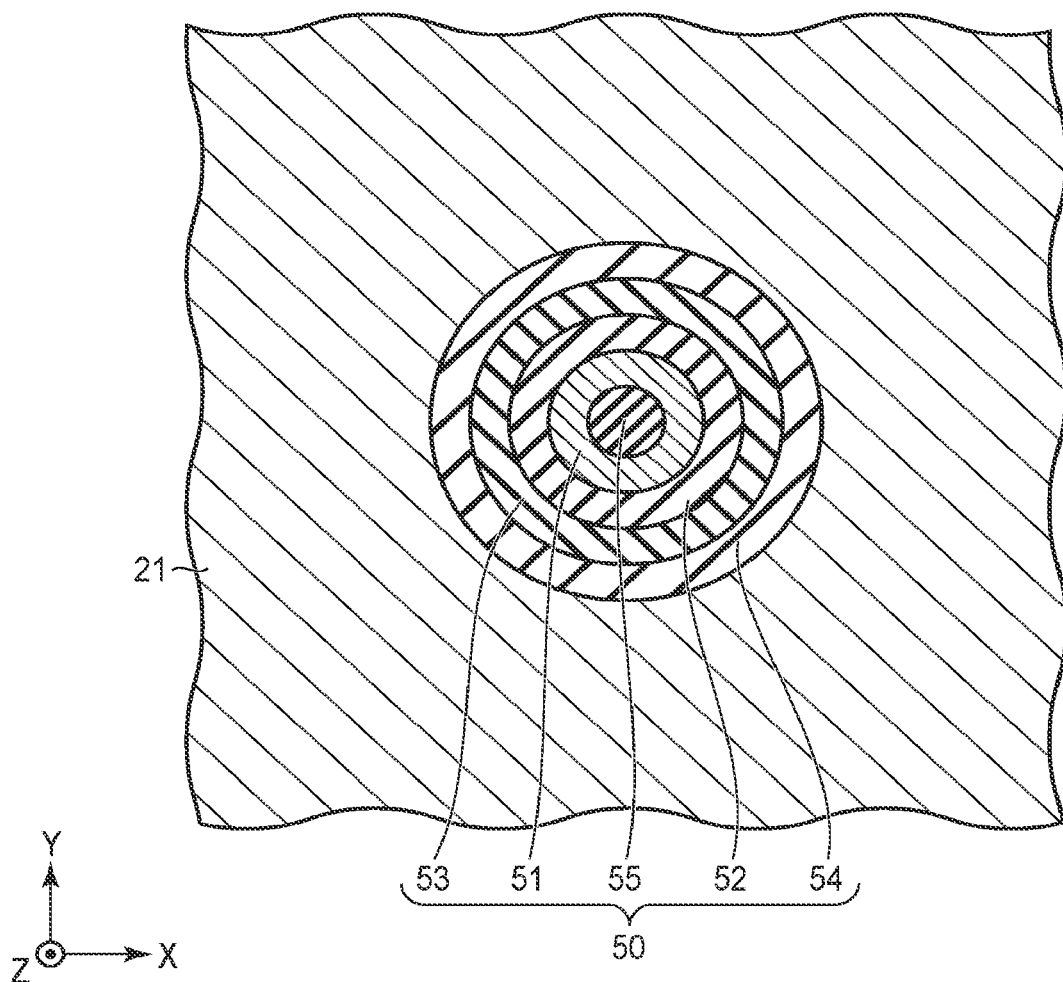
FIG. 5 is a schematic cross-sectional view of the detailed structure of the memory cell part of the semiconductor memory device of the first embodiment.

FIGS. 4 and 5 are schematic cross-sectional views of the detailed structure of a memory cell part including the conductive layer 21 and the pillar structure 50. FIG. 4 is a cross-sectional view parallel to the Z direction, and FIG. 5 is a cross-sectional view perpendicular to the Z direction.

In the memory cell part, the pillar structure 50 includes a semiconductor layer 51, tunnel insulating layer 52, charge storage layer 53, block insulating layer 54, and core insulating layer 55. The semiconductor layer 51, tunnel insulating layer 52, charge storage layer 53, and block insulating layer 54 are each formed in a cylindrical shape, and the core insulating layer 55 is formed in a columnar shape. More specifically, the semiconductor layer 51 surrounds the side surface of the core insulating layer 55, tunnel insulating layer 52 surrounds the side surface of the semiconductor layer 51, charge storage layer 53 surrounds the side surface of the tunnel insulating layer 52, and block insulating layer 54 surrounds the side surface of the charge storage layer 53. The semiconductor layer 51 is formed of silicon, tunnel insulating layer 52 is formed of a silicon oxide, charge storage layer 53 is formed of a silicon nitride, block insulating layer 54 is formed of a silicon oxide, and core insulating layer 55 is formed of a silicon oxide.

The conductive layer 21 surrounding the pillar structure 50 functions as a gate electrode, and the memory cell is formed by the part of the conductive layer 21 functioning as the gate electrode, and the part of the pillar structure 50 surrounded by the conductive layer 21.

Note that, the structure of the select transistor part (upper select transistor and lower select transistor) is the same as that of the memory cell part shown in FIGS. 4 and 5. In the select transistor part, the entirety of the tunnel insulating layer 52, charge storage layer 53, and block insulating layer 54 functions as a gate insulating layer.

The stairs region 200 of FIG. 2B has, as described above, a stair-like end defined by a plurality of steps 30. In the example of FIG. 2B, one step 30 is formed with respect to one conductive layer 21. That is, a step 30 is provided for each word line formed of the conductive layer 21.

The end of the stacked layer body 20 is covered with a stopper insulating layer 70 disposed along the stair-like end of the stacked layer body 20 between the insulating region 40 and the stacked layer body 20. The stopper insulating layer 70 functions as an etching stopper at the time when a contact hole which will be described later is formed. The stopper insulating layer 70 is not formed on the upper surface of the uppermost insulating layer 22U1. That is, the stopper insulating layer 70 does not extend between the insulating region 40 and the uppermost conductive layer 21U1 disposed to correspond to the uppermost rising part (first rising part) 31a. The stopper insulating layer 70 includes a lower stopper insulating layer 71 and an upper stopper insulating layer 72 disposed on the lower stopper insulating layer 71. The lower stopper insulating layer 71 is formed of a silicon oxide and the upper stopper insulating layer 72 is formed of a silicon nitride. The insulating region 40 formed of a silicon oxide or the like has an etching rate at the time of forming the contact hole greater than that of the upper stopper insulating layer 72 formed of a silicon nitride.

To the part corresponding to the steps 30 of the conductive layer 21, contacts (first contacts) 80a to 80j are connected. Each of the contacts 80a to 80j extends in the Z direction through the insulating region 40. The contacts 80a to 80j are provided for corresponding steps 30 and are connected to corresponding conductive layers 21.

The contact 80a passes through the uppermost insulating layer 22U1 on the uppermost conductive layer 21U1, and is connected to the uppermost conductive layer 21U1 disposed to correspond to the uppermost rising part 31a. Furthermore, the contact 80a passes through the uppermost conductive layer 21U1 and the second insulating layer 22U2 from the top, which is just below the uppermost conductive layer 21U1, and is connected to the second conductive layer 21U2 disposed to correspond to the second rising part 31b from the top (second rising part) positioned on the lower layer side of the uppermost rising part 31a.

Furthermore, as viewed from the Z direction, the contacts 80a to 80j are arranged in the X direction at substantially same intervals. Thus, as viewed from the Z direction, a distance between the uppermost rising part 31a and the contact 80a is shorter than a distance between the uppermost rising part 31a and the second rising part 31b.

The contact 80b adjacent to the contact 80a in the X direction passes through the stopper insulating layer 70 and the second insulating layer 22U2 from the top, and is connected to the second conductive layer 21U2.

As can be understood from the above, in the present embodiment, the contacts 80a and 80b are electrically connected to the gate electrodes of two upper select transistors disposed in the memory region 100 via two conductive layers 21U1 and 21U2 functioning as the upper select gate lines.

Furthermore, the contacts 80c to 80j pass through the stopper insulating layer 70 and the corresponding insulating layers 22, and are connected to the corresponding conductive layers 21.

Each of the contacts 80c to 80h is electrically connected to the gate electrode of the corresponding memory cell transistor via the corresponding conductive layer 21 functioning as the word line.

Each of the contacts 80i and 80j is electrically connected to the gate electrode of two lower select transistors via the conductive layers 21L2 and 21L1 functioning as the lower select gate line.

Now, a manufacturing method of the semiconductor memory device of the present embodiment will be explained with reference to the cross-sectional views of FIGS. 6A to 6D.

In the process of FIG. 6A, a stacked film in which a plurality of insulating layers 22 and a plurality of sacrificial layers 23 are alternately stacked is formed on a semiconductor substrate 10. At that time, the stacked film is formed such that the thickness of the uppermost insulating layer 22 is thicker than the other insulating layers 22. Furthermore, on the stacked film, a mask layer 91 is formed, which functions as a mask in a flattening process (which will be described later) to be performed after the end of the stacked film is processed into a stair-like shape. The mask layer 91 is formed of a silicon nitride, insulating layer 22 is formed of a silicon oxide, and sacrificial layer 23 is formed of a silicon nitride. Then, by performing lithography and etching such as reactive ion etching (RIE), the mask layer 91, uppermost insulating layer 22, and uppermost sacrificial layer 23 are patterned. Thus, in the region of the stacked film to be processed into the stair-like shape later, the surface of the second insulating layer 22 from the top is exposed.

In the step of FIG. 6B, the lower layer side insulating layers 22 and the sacrificial layers 23 are patterned to form a stacked layer body 20a having a stair-like end. In the present embodiment, the insulating layer 22 is positioned on the upper layer side of each step of the stacked layer body 20a, and the sacrificial layer 23 is positioned on the lower layer side thereof.

Figure 6C:
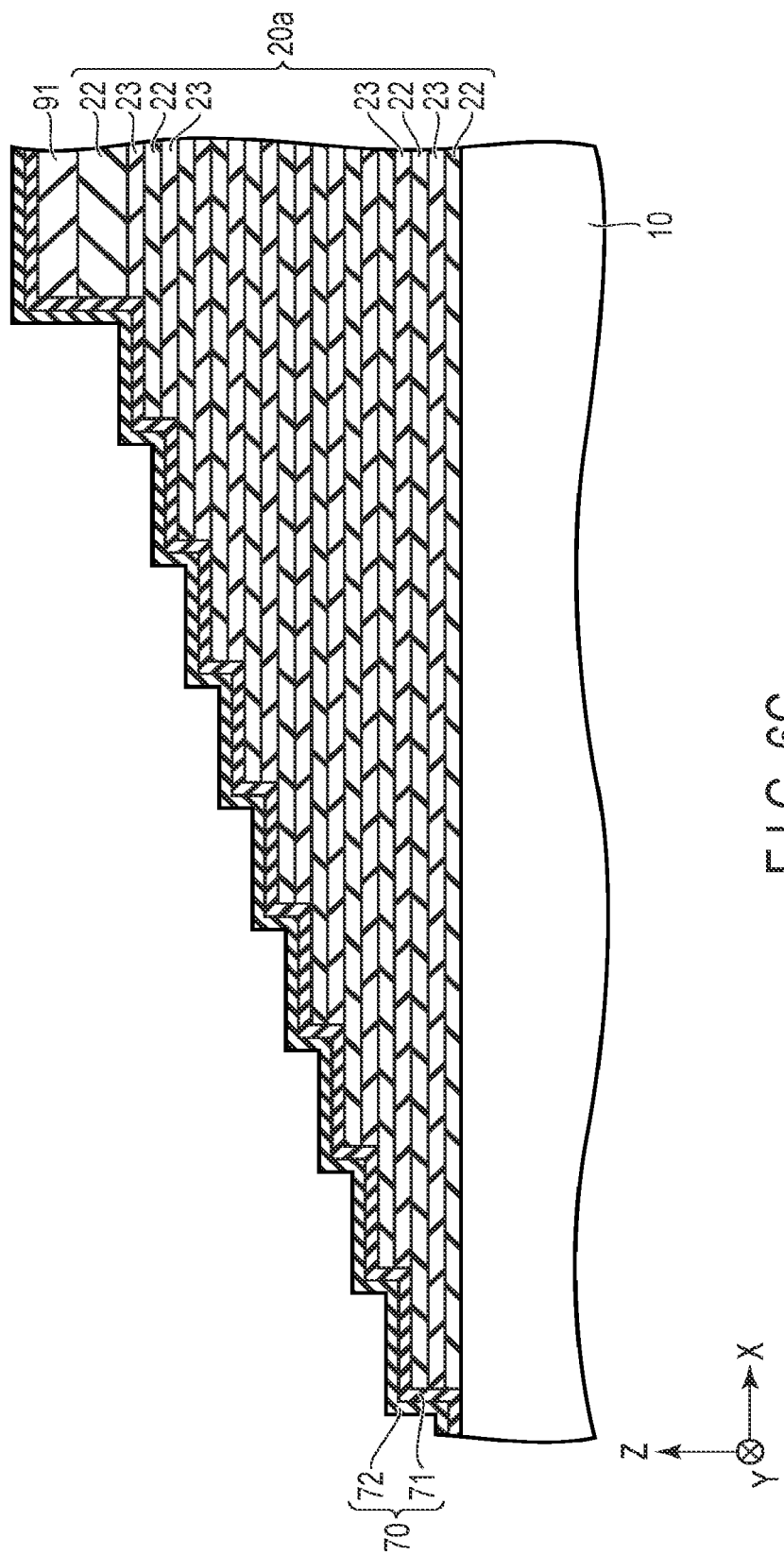
FIG. 6C is a schematic cross-sectional view of a part of the manufacturing method of the semiconductor memory device of the first embodiment.

In the step of FIG. 6C, the stopper insulating layer 70 (lower stopper insulating layer 71 and upper stopper insulating layer 72) is formed on the entire surface. Thus, the stair-like end of the stacked layer body 20a and the upper and side surfaces of the mask layer 91 are covered with the stopper insulating layer 70.

In the step of FIG. 6D, after the insulating layer 41 is formed on the entire surface, the insulating layer 41 is flattened using the mask layer 91 as a mask, and the mask layer 91 and the stopper insulating layer 70 formed on the mask layer 91 are removed. Then, a memory hole is formed in the memory region 100 (not shown in FIG. 6D), and a semiconductor layer and the like for the memory cell transistor and the select transistor is formed in the memory hole. Then, a slit (which is not shown) is formed in the stacked layer body 20a, and the sacrificial layers 23 are selectively etched by introducing etching fluid from the slit. By the selective etching, the parts where the sacrificial layers 23 are formed become empty spaces. When the empty spaces are filled with a metal material such as tungsten (W), the conductive layers 21 are formed. As above, a plurality of conductive layers 21 and a plurality of insulating layers 22 are stacked alternately to achieve the stacked layer body 20 having the stair-like end.

Then, the insulating region 40 including the above-mentioned insulating layer 41 is formed. Furthermore, contact holes are formed in the insulating region 40, stopper insulating layer 70, and insulating layers 22, and the contacts 80a to 80j are formed in the contact holes. The contact 80a is formed in the contact hole which passes through the uppermost conductive layer 21U1 to reach the second conductive layer 21U2 which is adjacent to the uppermost conductive layer 21U1.

Through the above process, the semiconductor memory device with the structure shown in FIGS. 2A and 2B is formed.

Note that, the depth of the contact hole for the contact 80a and the depth of the contact hole for the contact 80j greatly differ. Thus, when the contacts 80a to 80j are formed in a single process, the contact hole for the contact 80a, which is formed without through the stopper insulating layer 70, may reach the conductive layer 21 functioning as the word line.

In such a case, the number of layers of the conductive layer 21 functioning as the upper select gate lines is suitably adjusted to prevent the contact hole for the contact 80a from reaching the conductive layer 21 set as the uppermost word line.

With the above-described structure, the present embodiment can achieve the following advantages.

Conventionally, the contact connected to the uppermost conductive layer passes through the stopper insulating layer at a position corresponding to the second step to be connected to the uppermost conductive layer.

In contrast, in the present embodiment, the contact 80a is connected to the uppermost conductive layer 21U1 at a position corresponding to the uppermost step 30a. That is, in the present embodiment, the contact 80a is connected to the uppermost conductive layer 21U1 disposed to correspond to the uppermost rising part 31a by passing through the insulating region 40 above the stacked layer body 20 without through the stopper insulating layer 70. With such a structure, in the present embodiment, as compared to the conventional cases, the number of steps 30 of the stairs region 200 used for the connection to the contacts 80a to 80j can be reduced by one. As a result, in the present embodiment, the area of the stairs region 200 for providing the contacts 80a to 80j can be decreased.

Furthermore, in the present embodiment, since the number of steps 30 can be reduced, the manufacturing steps can be reduced, and the production costs can be reduced.

Furthermore, in the present embodiment, the contact 80a passes through the uppermost conductive layer 21U1 disposed to correspond to the uppermost rising part 31a and is further connected to the second conductive layer 21U2 disposed to correspond to the rising part 31b positioned on the lower layer side of the uppermost rising part 31a. That is, in the present embodiment, the contact 80a is connected to not only the conductive layer 21U1 but also the conductive layer 21U2. From a different standpoint, in the present embodiment, both the contacts 80a and 80b are connected to the second conductive layer 21U2. With the above structure, in the present embodiment, an open error with respect to the select transistors can be suppressed.

Note that, in the above-described embodiment, as shown in FIG. 2B, the contact 80a passes through the uppermost conductive layer 21U1 to be connected to the upper surface of the second conductive layer 21U2; however, the contact 80a may be connected to the conductive layer 21 as shown in FIGS. 7 to 11.

In a first connection example of FIG. 7, the contact 80a passes through the uppermost conductive layer 21U1, and extends to the inside (middle way) of the second conductive layer 21U2 to be connected to the second conductive layer 21U2.

In a second connection example of FIG. 8, the contact 80a passes through the uppermost conductive layer 21U1, and extends to the inside (middle way) of the second insulating layer 22U2 from the top, which is just below the uppermost conductive layer 21U1. Thus, the contact 80a is connected to the uppermost conductive layer 21U1 alone, and is not connected to the second conductive layer 21U2.

Figure 9:
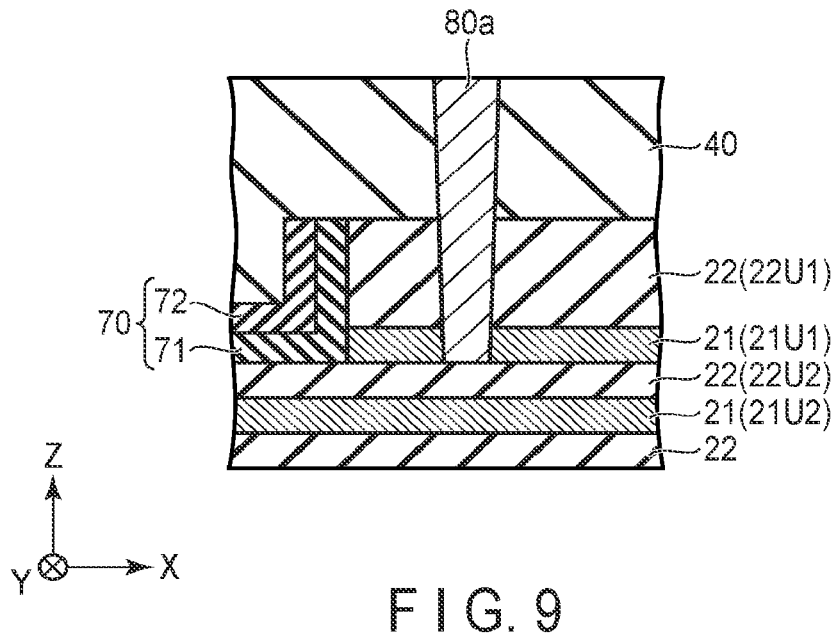
FIG. 9 is a schematic cross-sectional view of a third connection example of the contact and the conductive layer in the semiconductor memory device of the first embodiment.

In a third connection example of FIG. 9, the contact 80a passes through the uppermost conductive layer 21U1 to contact the upper surface of the second insulating layer 22U2 from the top, which is just below the uppermost conductive layer 21l1. Thus, the contact 80a is connected to the uppermost conductive layer 21U1 alone, and is not connected to the second conductive layer 21U2.

Figure 10:
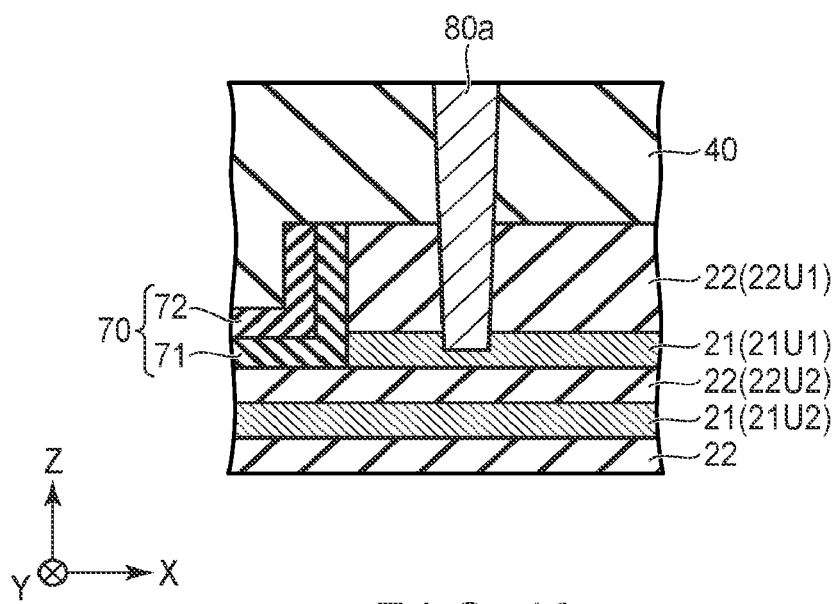
FIG. 10 is a schematic cross-sectional view of a fourth connection example of the contact and the conductive layer in the semiconductor memory device of the first embodiment.

In a fourth connection example of FIG. 10, the contact 80a extends to the inside (middle way) of the uppermost conductive layer 21U1 to be connected to the uppermost conductive layer 21U1 alone, and not to be connected to the second conductive layer 21U2.

Figure 11:
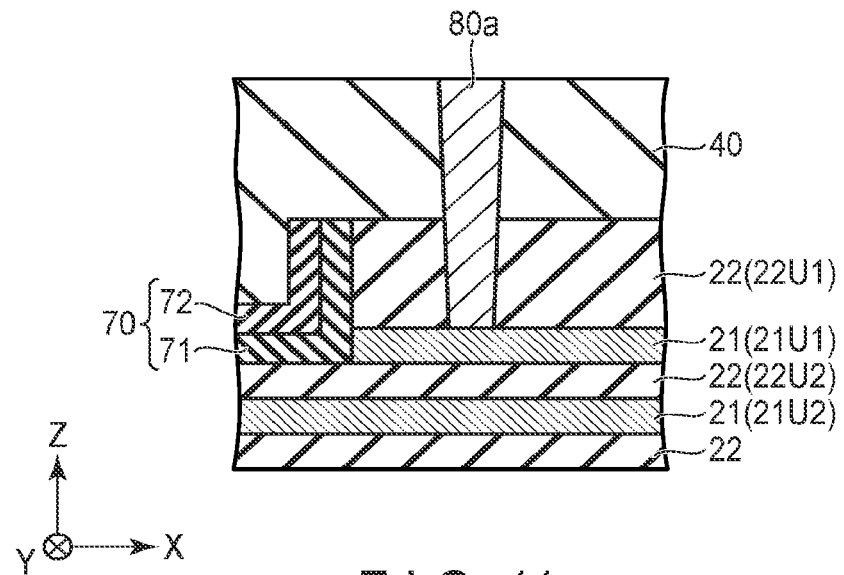
FIG. 11 is a schematic cross-sectional view of a fifth connection example of the contact and the conductive layer in the semiconductor memory device of the first embodiment.

In a fifth connection example of FIG. 11, the contact 80a is connected to the upper surface of the uppermost conductive layer 21U1, and is not connected to the second conductive layer 21U2.

Also in the structures of FIGS. 7 to 11, an area of the stairs region 200 where the contacts 80a to 80j are disposed can be decreased, and the manufacturing steps can be reduced.

Figure 12:
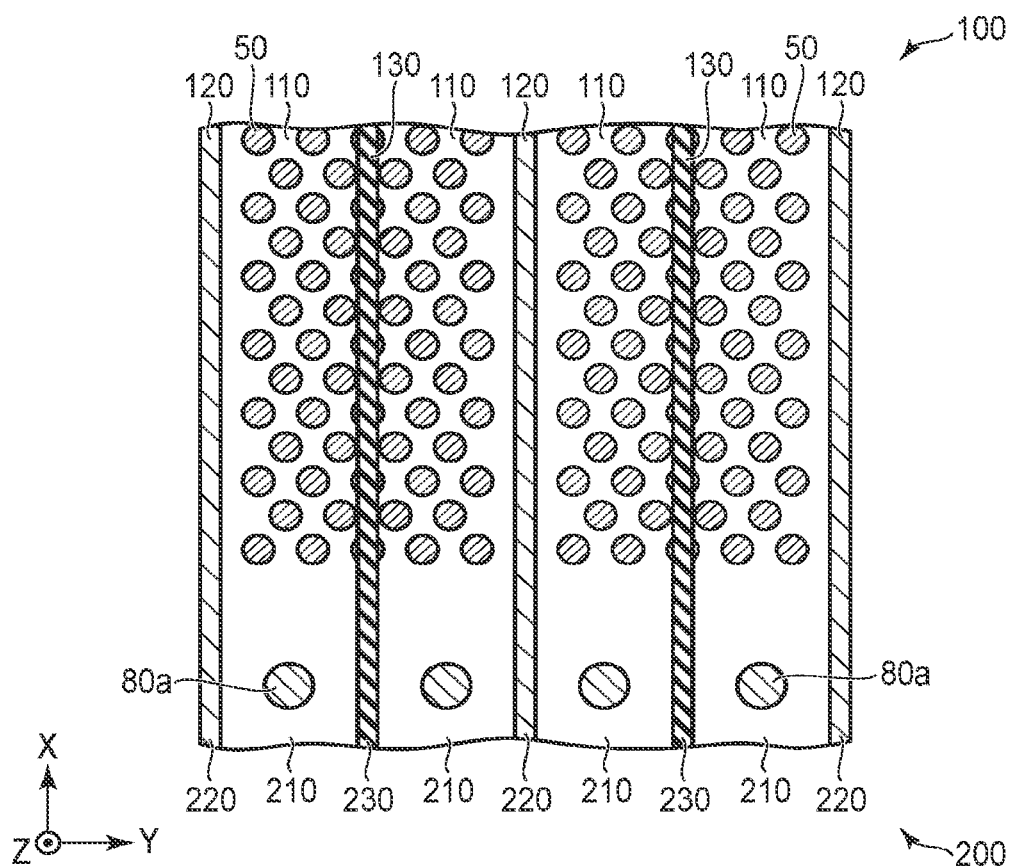
FIG. 12 is a schematic view of the arrangement structure near a boundary between the memory region and the stairs region of the semiconductor memory device of the first embodiment.

FIG. 12 is a schematic view of the arrangement structure near the boundary between the memory region and the stairs region of the semiconductor memory device of the first embodiment. As shown in FIG. 12, the memory region 100 of FIG. 1 includes an array region 110, slit region 120, and half slit region 130. A memory cell array including the pillar structure 50 is provided in the array region 110. The slit region 120 has a structure in which a predetermined material is filled in the slit extending from the upper end to the lower end of the stacked layer body 20. The half slit region 130 extends from the upper end to a predetermined position of the stacked layer body 20, and has a structure in which an insulating material is filled in the slit which separates a certain number of conductive layers 21 (in this example, the uppermost conductive layer 21U1 and the second conductive layer 21U2) from the top in the Y direction. In each array region 110 partitioned by the slit region 120 and the half slit region 130, the upper select gate line is commonly used.

The stairs region 200 includes a contact region 210, slit region 220, and half slit region 230. The slit region 220 and the half slit region 230 are continuous from the slit region 120 and the half slit region 130 of the memory region 100, respectively, and the contact 80 is disposed in each contact region 210 partitioned by the slit region 220 and the half slit region 230. Thus, the contact 80 is connected in the contact region 210 partitioned by the slit region 220 and the half slit region 230 with respect to the common upper select gate line in the array region 110 partitioned by the slit region 120 and the half slit region 130.

The arrangement of FIG. 12 including the array region 110, contact region 210, slit regions 120 and 220, and half slit regions 130 and 230 is repeated in the Y direction to form the memory region 100 and the stairs region 200 of FIG. 1. As above, many contacts 80a each connected to the uppermost conductive layer 21U1 for each region in which the upper select gate line is commonly used are provided in a wide area (which is not shown in FIG. 12) of the contact region 210. Thus, depths of the contacts 80a may vary in areas because of etching process. Thus, for example, contacts 80a in one memory chip may reach different depths as in FIGS. 2B, and 7 to 11.

Second Embodiment

Now, the second embodiment will be explained. Note that, basic matters are the same as those of the above-described first embodiment, and the matters explained in the first embodiment will be omitted from the following description.

Figure 13:
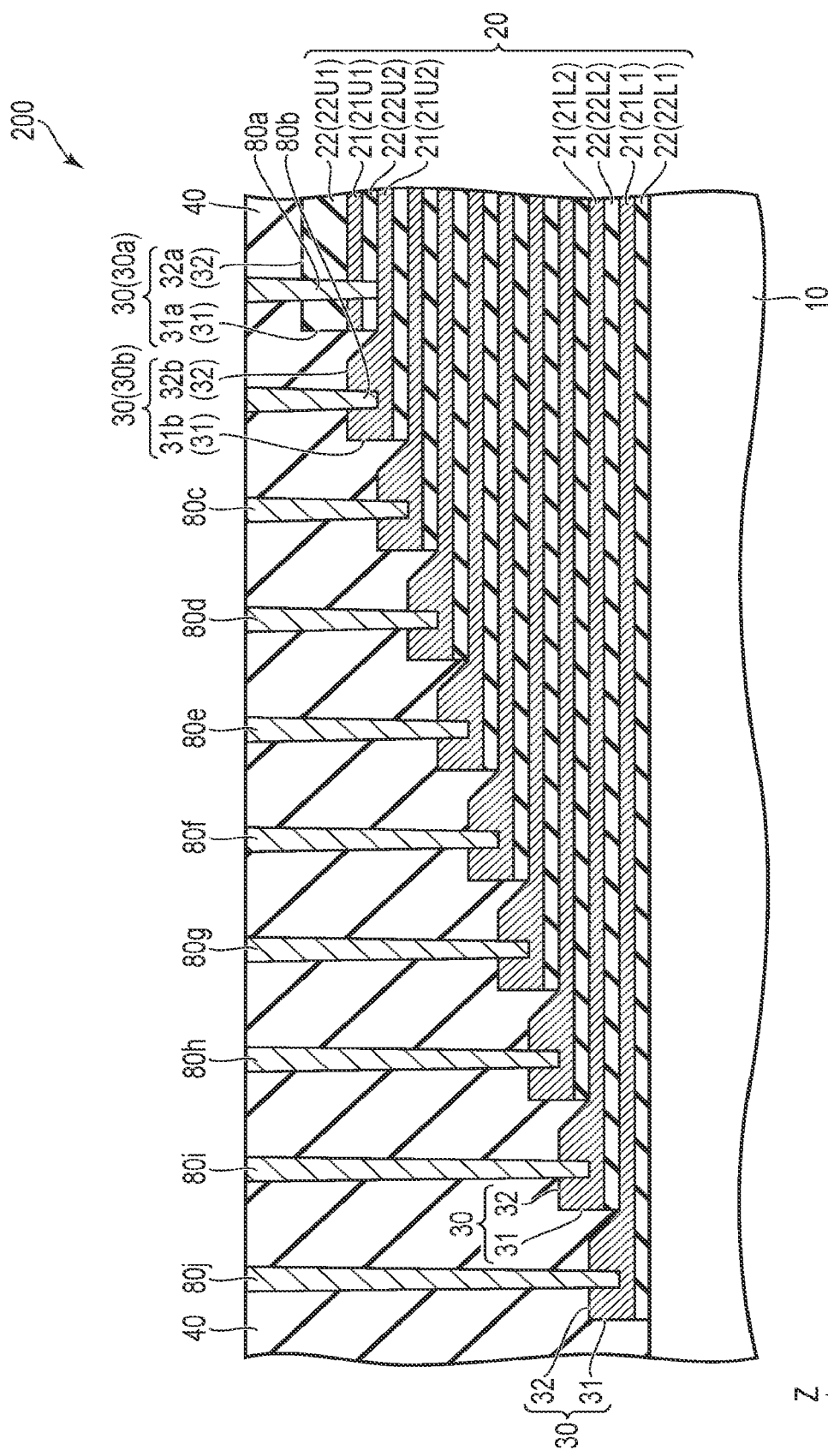
FIG. 13 is a schematic cross-sectional view of the structure of a stairs region of a semiconductor memory device of a second embodiment.

FIG. 13 is a schematic cross-sectional view of the structure of a stairs region 200 of a semiconductor memory device of the second embodiment. Note that, the basic structure of the memory region 100 is the same as that of the first embodiment.

In the present embodiment, except for the uppermost conductive layer 21U1, the thickness of each of conductive layers 21 increases at a terrace part 32 (except for terrace part 32a) near the end of each conductive layer 21. Thus, the thicknesses of the conductive layers 21 other than the uppermost conductive layer 21U1 increases near the part to which corresponding one of contacts 80b to 80j is connected. Accordingly, the thickness of the uppermost conductive layer 21U1 near the part to which corresponding contact 80a is connected is smaller than a thickness of the terrace part (with the increased thickness) of each of other conductive layers 21.

Furthermore, in the present embodiment, the stopper insulating layer 70 as shown in FIG. 2B of the first embodiment is not provided. Thus, in the present embodiment, the contacts 80b to 80j are connected directly at the parts where the thicknesses of the conductive layers 21 increase.

Now, a manufacturing method of the semiconductor memory device of the present embodiment will be explained with reference to the cross-sectional views of FIGS. 14A to 14D.

The basic process of FIG. 14A is the same as the process of FIG. 6A of the first embodiment. That is, on a semiconductor substrate 10, a stacked film in which a plurality of insulating layers 22 and a plurality of sacrificial layers 23 are stacked alternately and a mask layer 91 are formed. The mask layer 91 is formed of a silicon nitride, insulating layer 22 is formed of a silicon oxide, and sacrificial layer 23 is formed of a silicon nitride. Then, the mask layer 91, uppermost insulating layer 22, and uppermost sacrificial layer 23 are patterned using lithography and etching such as an RIE to expose the surface of the second insulating layer 22 from the top.

Figure 14B:
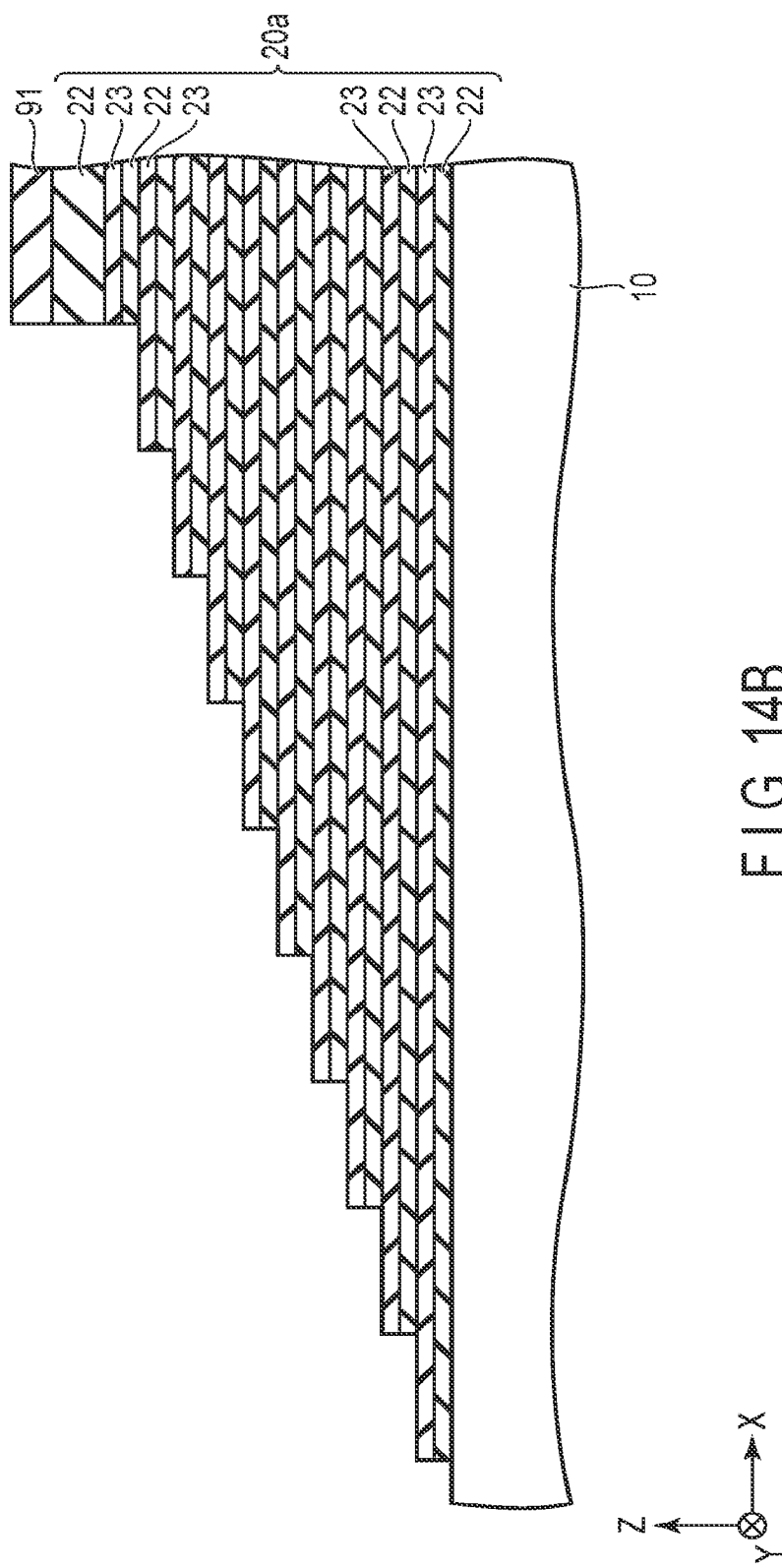
FIG. 14B is a schematic cross-sectional view of a part of the manufacturing method of the semiconductor memory device of the second embodiment.

In a step of FIG. 14B, the lower layer side insulating layer 22 and sacrificial layer 23 are successively patterned to form a stacked layer body 20a having a stair-like end. In the present embodiment, the sacrificial layer 23 is positioned on the upper layer side of each step of the stacked layer body 20a, and the insulating layer 22 is positioned on the lower layer side of each step.

Figure 14C:
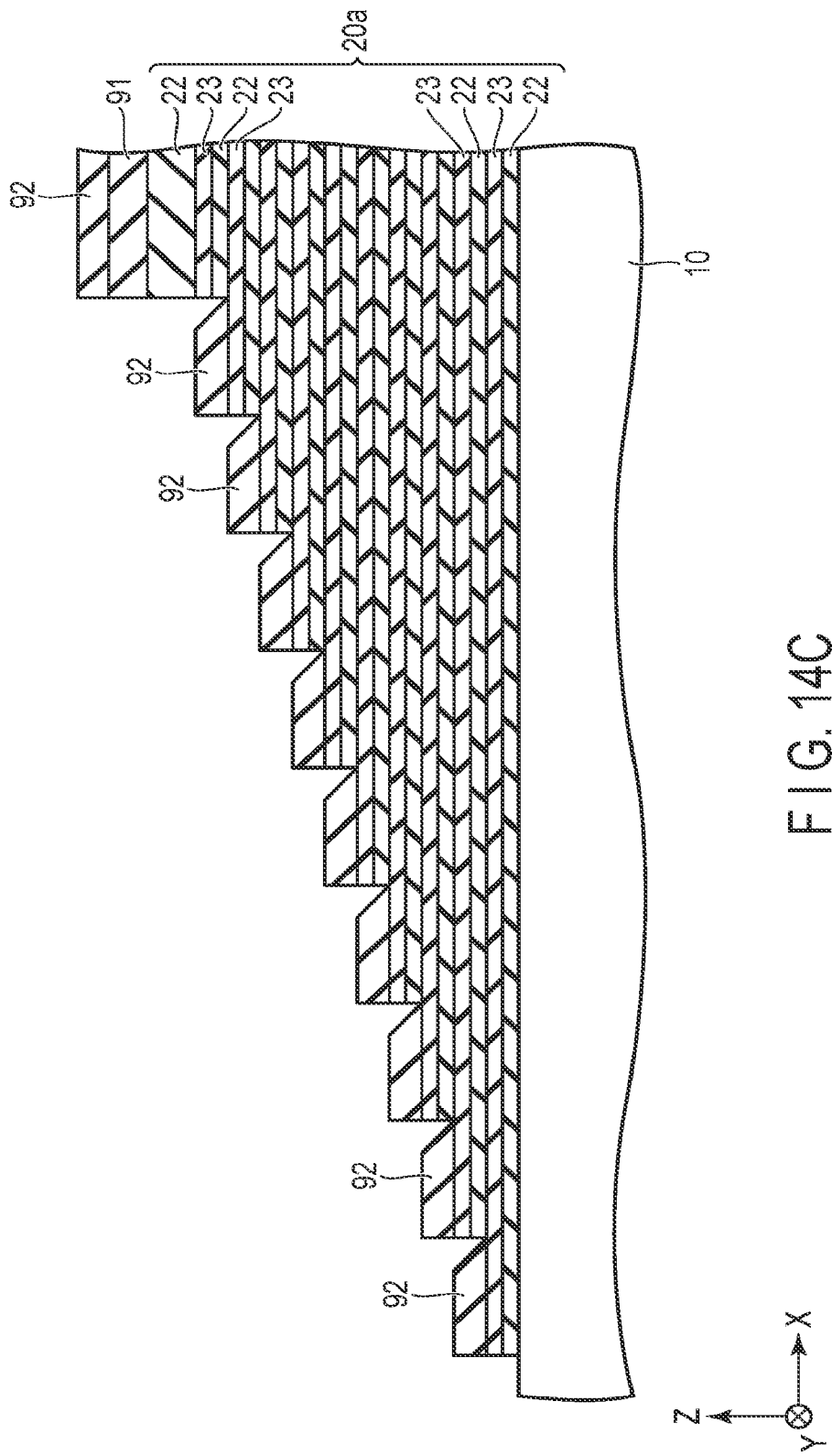
FIG. 14C is a schematic cross-sectional view of a part of the manufacturing method of the semiconductor memory device of the second embodiment.

In a step of FIG. 14C, the sacrificial layer 92 is formed on the entire surface. The sacrificial layer 92 is formed of the same material used for the sacrificial layer 23. That is, the sacrificial layer 92 is formed of a silicon nitride. Then, by performing anisotropic etching to selectively remove the part positioned near the rising part of each step of the sacrificial layer 92 in the X and Y directions, the shape of the sacrificial layer 92 as shown in FIG. 14C is achieved.

Figure 14D:
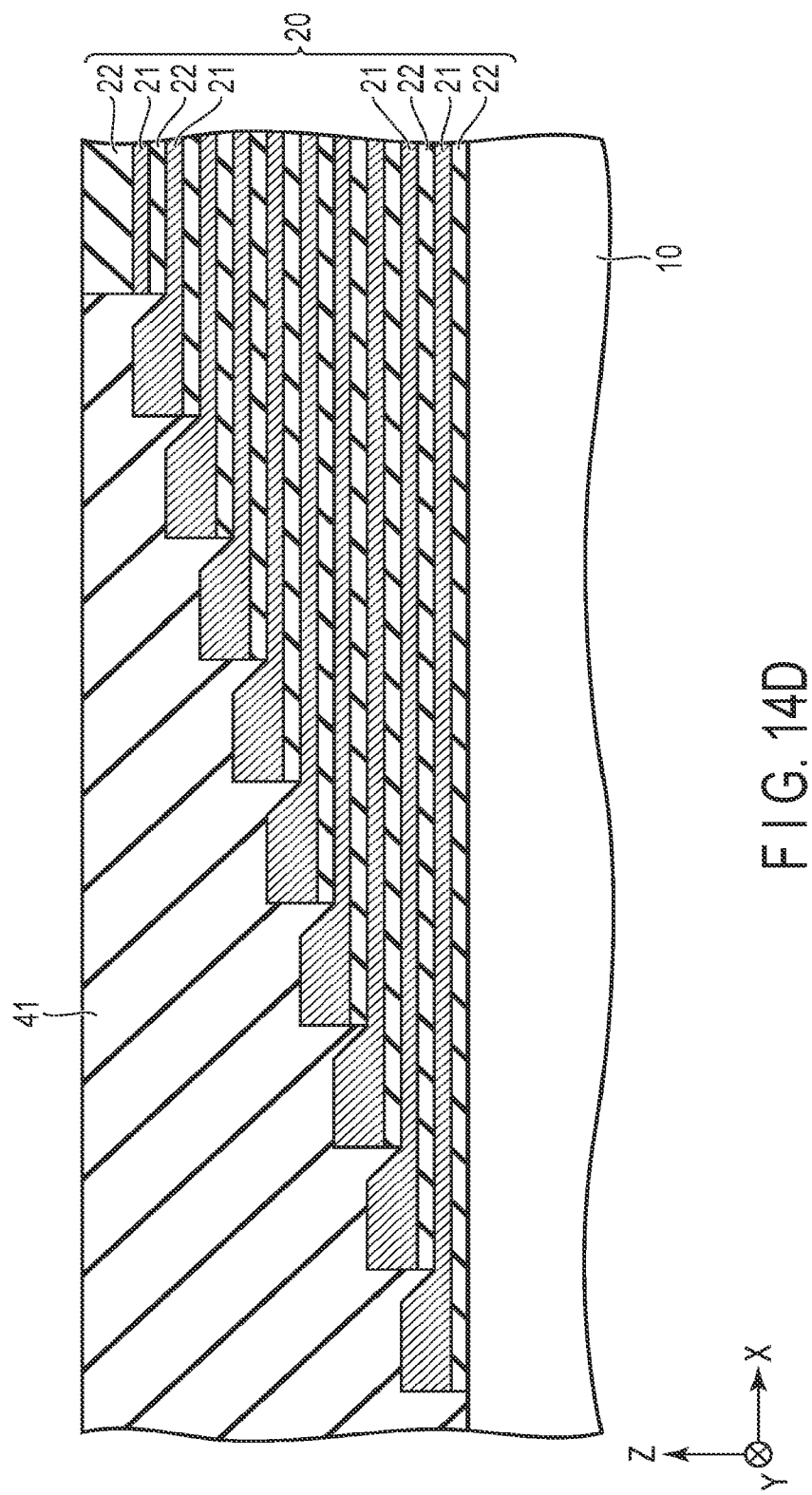
FIG. 14D is a schematic cross-sectional view of a part of the manufacturing method of the semiconductor memory device of the second embodiment.
Figure 15:
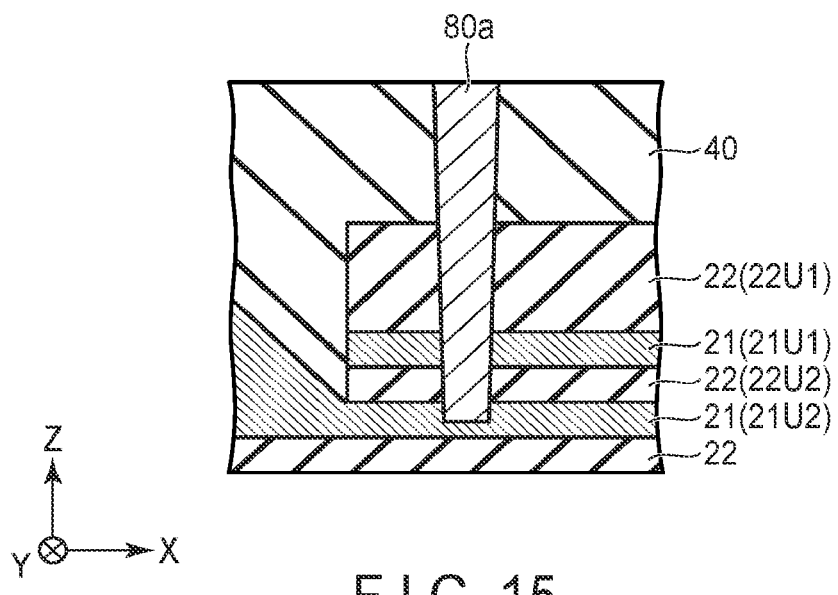
FIG. 15 is a schematic cross-sectional view of a first connection example of a contact and a conductive layer in the semiconductor memory device of the second embodiment.
Figure 16:
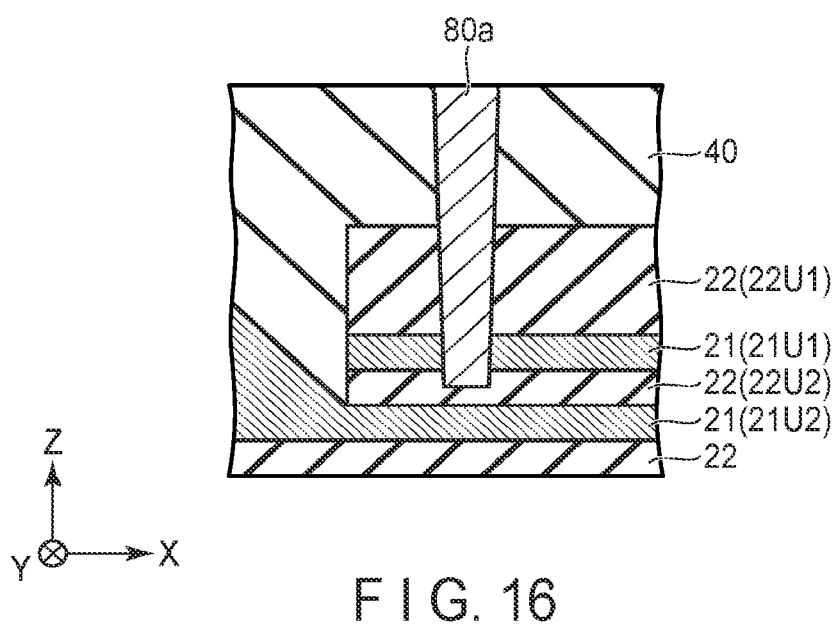
FIG. 16 is a schematic cross-sectional view of a second connection example of the contact and the conductive layer in the semiconductor memory device of the second embodiment.
Figure 17:
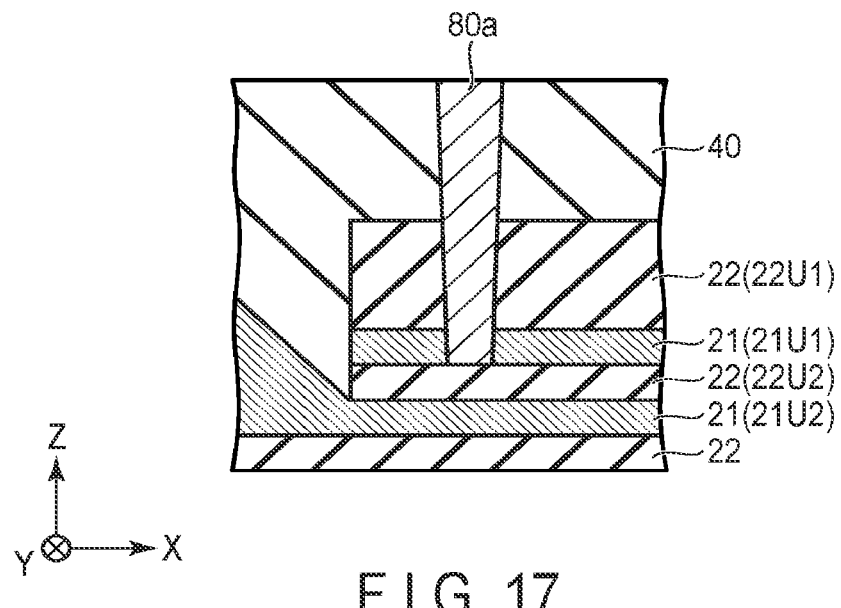
FIG. 17 is a schematic cross-sectional view of a third connection example of the contact and the conductive layer in the semiconductor memory device of the second embodiment.
Figure 18:
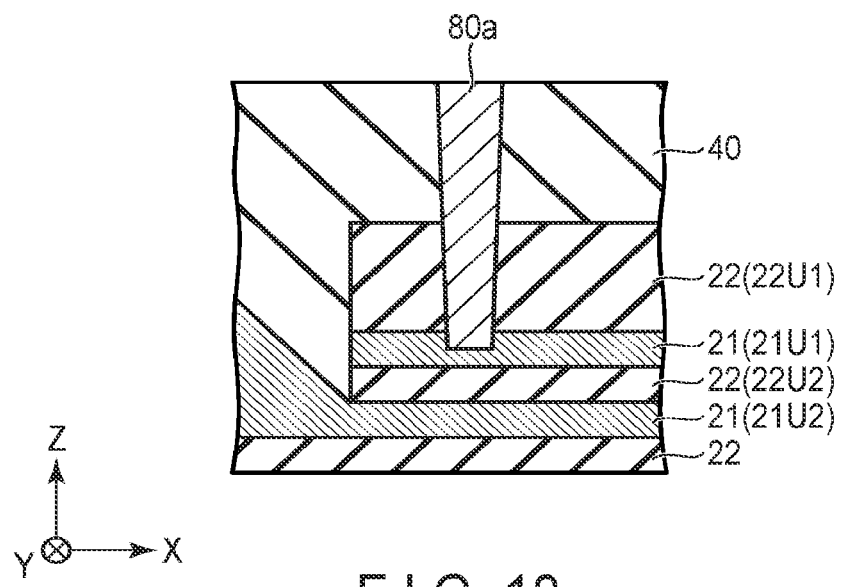
FIG. 18 is a schematic cross-sectional view of a fourth connection example of the contact and the conductive layer in the semiconductor memory device of the second embodiment.

In a step of FIG. 14D, after the insulating layer 41 is formed on the entire surface, the insulating layer 41 is flattened while the mask layer 91 and the sacrificial layer 92 formed on the mask layer 91 are removed. Then, memory holes are formed in the memory region 100 (which is not shown in FIG. 14D), and a semiconductor layer or the like for the memory cell transistor and the select transistor is formed in each memory hole. Then, a slit (which is not shown) is formed in the stacked layer body 20a, and the sacrificial layers 23 and 92 are selectively etched by introducing an etching fluid from the slit. By the selective etching, spaces are formed in the parts where the sacrificial layers 23 and 92 were formed. Furthermore, by filling a metal material such as tungsten (W) in the space, the conductive layers 21 are formed. Through the above process, the stacked layer body 20 in which the conductive layers 21 and the insulating layers 22 are stacked alternately and having a stair-like end can be achieved.

Then, an insulating region 40 including the above-described insulating layer 41 is formed. Furthermore, contact holes passing through the insulating region 40 to reach the part of the conductive layer 21 where the thickness thereof is increased, and contacts 80b to 80j are formed in the contact holes. The contact 80a is formed in the contact hole which passes through the insulating region 40, uppermost insulating layer 22U1, uppermost conductive layer 21U1, and second insulating layer 22U2 from the top to reach the second conductive layer 21U2 which is adjacent to the uppermost conductive layer 21U1.

As above, the semiconductor memory device with the structure of FIG. 13 is formed.

As described above, in the present embodiment, as in the first embodiment, the contact 80a is connected to the uppermost conductive layer 21U1 at a position corresponding to the uppermost step 30a. That is, in the present embodiment, the contact 80a is connected to the uppermost conductive layer 21U1 disposed to correspond to the uppermost rising part 31a. Thus, in the present embodiment, as in the first embodiment, the area of the stairs region 200 where the contacts 80a to 80j are disposed can be reduced. Furthermore, in the present embodiment, as in the first embodiment, the number of steps 30 of the stairs region 200 can be decreased, and thus, the manufacturing steps can be reduced, and the production costs can be reduced.

Furthermore, in the present embodiment, as in the first embodiment, the contact 80a passes through the uppermost conductive layer 21U1 disposed to correspond to the uppermost rising part 31a to be further connected to the second conductive layer 21U2 disposed to correspond to the rising part 31b positioned on the lower layer side of the uppermost rising part 31a. Thus, in the present embodiment, as in the first embodiment, an open error with respect to the select transistors can be suppressed.

In the above-described embodiment, as shown in FIG. 13, the contact 80a passes through the uppermost conductive layer 21U1 to be connected to the upper surface of the second conductive layer 21U2; however, the contact 80a may be connected to the conductive layer 21 according to first to fifth connection examples shown in FIGS. 15 to 19, that is the same as the first to fifth connection examples of the first embodiment shown in FIGS. 7 to 11.

Note that, in the above-described first and second embodiments, two upper select transistors are utilized; however, the basic structure of the stairs region 200 is the same as the first and second embodiments in a case where three or more upper select transistors are utilized. That is, the structure of the stairs region 200 is the same as the first and second embodiments, and the conductive layers 21 the number of which corresponds to the number of upper select transistors function as the upper select gate lines. For example, if four upper select transistors are used, the uppermost conductive layer 21U1 to fourth conductive layer 21 from the top function as the upper select gate lines.

Furthermore, in the above-described first and second embodiments, one conductive layer 21 is provided with respect to one step 30; however, two or more conductive layers 21 may be provided with respect to one step 30. In that case, two or more stairs are provided in the Y direction in FIGS. 2B and 13. However, in that case, in each contact region, the structure of the uppermost step 30a is the same as that of the above-described first and second embodiments. That is, one conductive layer 21 (uppermost conductive layer 21U1) is provided with respect to the uppermost step 30a, and as in FIGS. 2B and 13, the contact 80a is connected to the uppermost conductive layer 21U1. Furthermore, as in FIGS. 2B and 13, the contact 80a may be connected to the second conductive layer 21U2 from the top.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked layer body including a plurality of conductive layers stacked to be apart from each other in a first direction and being provided in a memory region and stairs region, the stacked layer body in the stairs region including a stair-like end portion with a plurality of rising parts and a plurality of terrace parts, wherein a plurality of successive first conductive layers including an uppermost conductive layer of the plurality of conductive layers function as select gate lines for a NAND string, and a plurality of second conductive layers positioned on a lower layer side of the plurality of successive first conductive layers function as word lines for the NAND string;
a plurality of pillar structures each including a semiconductor layer extending in the first direction through the stacked layer body in the memory region;
an upper insulating layer provided to cover the stacked layer body in the stairs region; and
a plurality of contacts passing through the upper insulating layer to be connected to the plurality of conductive layers, respectively, wherein
the plurality of successive first conductive layers other than the uppermost conductive layer of the plurality of successive first conductive layers each has a first thickness within the memory region and a second thickness larger than the first thickness within the stairs region near a part of the each of the plurality of first conductive layers other than the uppermost conductive layer, thereby forming one terrace part of the plurality of terrace parts, corresponding one contact of the plurality of contacts being connected to the part of the each of the plurality of first conductive layers other than the uppermost conductive layer,
the uppermost conductive layer of the plurality of successive first conductive layers has a third thickness within the memory region and a fourth thickness within the stairs region near a part to which corresponding another one contact of the plurality of contacts is connected, and
a difference between the second thickness and the first thickness is larger than a difference between the fourth thickness and the third thickness.

2. The device of claim 1, wherein
the plurality of successive first conductive layers other than the uppermost conductive layer of the plurality of successive first conductive layers include one first conductive layer which is adjacent to the uppermost conductive layer, the uppermost conductive layer being provided to correspond to a first rising part which is an uppermost one of the plurality of rising parts and the one first conductive layer being provided to correspond to a second rising part positioned on a lower layer side of the first rising part, and as viewed from the first direction, a distance between the first rising part and the another one contact is shorter than a distance between the first rising part and the second rising part.

3. The device of claim 1, wherein
the another one contact connected to the part of the uppermost conductive layer is electrically connected to one first conductive layer of the plurality of first conductive layers, which is adjacent to the uppermost conductive layer on a lower layer side of the uppermost conductive layer.

4. The device of claim 1, wherein
the another one contact connected to the part of the uppermost conductive layer does not extend to one first conductive layer of the plurality of first conductive layers, which is adjacent to the uppermost conductive layer on a lower layer side of the uppermost conductive layer.

5. The device of claim 1, wherein
at least one second conductive layer of the plurality of second conductive layers has an increased thickness within the stairs region near a part of the one second conductive layer, thereby forming another one terrace part of the plurality of terrace parts, a corresponding contact of the plurality of contacts being connected to the part of the one second conductive layer.

6. The device of claim 5, wherein
the one second conductive layer has a substantially same thickness as the second thickness within the stairs region near the part of the one second conductive layer.

7. The device of claim 5, wherein
the one second conductive layer has a fifth thickness within the memory region and a sixth thickness as the increased thickness within the stairs region, and
a difference between the sixth thickness and the fifth thickness is larger than the difference between the fourth thickness and the third thickness.

8. The device of claim 1, wherein
the stacked layer body includes a structure in which the plurality of conductive layers and a plurality of insulating layers are stacked alternately in the first direction.

9. A semiconductor memory device comprising:
a stacked layer body including a plurality of conductive layers stacked to be apart from each other in a first direction and being provided in a memory region and stairs region, the stacked layer body in the stairs region including a stair-like end portion with a plurality of rising parts and a plurality of terrace parts, wherein a plurality of successive first conductive layers including an uppermost conductive layer of the plurality of conductive layers function as select gate lines for a NAND string, and a plurality of second conductive layers positioned on a lower layer side of the plurality of successive first conductive layers function as word lines for the NAND string;
a plurality of pillar structures each including a semiconductor layer extending in the first direction through the stacked layer body in the memory region;
an upper insulating layer provided to cover the stacked layer body in the stairs region; and
a plurality of contacts passing through the upper insulating layer to be connected to the plurality of conductive layers, respectively, wherein the plurality of conductive layers, other than the uppermost conductive layer of the plurality of conductive layers, each has a first thickness within the memory region and a second thickness larger than the first thickness within the stairs region near a part of the each of the plurality of conductive layers other than the uppermost conductive layer, thereby forming one terrace part of the plurality of terrace parts, corresponding one contact of the plurality of contacts being connected to the part of the each of the plurality of conductive layers other than the uppermost conductive layer, the uppermost conductive layer has a third thickness within the memory region and a fourth thickness within the stairs region near a part to which corresponding another one contact of the plurality of contacts is connected, and a difference between the second thickness and the first thickness is larger than a difference between the fourth thickness and the third thickness.

10. The device of claim 9, wherein
the plurality of conductive layers other than the uppermost conductive layer include one conductive layer which is adjacent to the uppermost conductive layer, the uppermost conductive layer being provided to correspond to a first rising part which is an uppermost one of the plurality of rising parts and the one conductive layer being provided to correspond to a second rising part positioned on a lower layer side of the first rising part, and as viewed from the first direction, a distance between the first rising part and the another one contact is shorter than a distance between the first rising part and the second rising part.

11. The device of claim 9, wherein
the another one contact connected to the part of the uppermost conductive layer is electrically connected to one first conductive layer of the plurality of first conductive layers, which is adjacent to the uppermost conductive layer on a lower layer side of the uppermost conductive layer.

12. The device of claim 9, wherein
the another one contact connected to the part of the uppermost conductive layer does not extend to one first conductive layer of the plurality of first conductive layers, which is adjacent to the uppermost conductive layer on a lower layer side of the uppermost conductive layer.

13. The device of claim 9, wherein
the stacked layer body includes a structure in which the plurality of conductive layers and a plurality of insulating layers are stacked alternately in the first direction.

14. A semiconductor memory device comprising:
a stacked layer body including a plurality of conductive layers stacked to be apart from each other in a first direction and being provided in a memory region and stairs region, the stacked layer body in the stairs region including a stair-like end portion with a plurality of rising parts and a plurality of terrace parts;
a plurality of pillar structures each including a semiconductor layer extending in the first direction through the stacked layer body in the memory region;
an upper insulating layer provided to cover the stacked layer body in the stairs region; and
a plurality of contacts passing through the upper insulating layer to be connected to the plurality of conductive layers, respectively, wherein the plurality of contacts include a first contact electrically connected to an uppermost conductive layer of the plurality of conductive layers provided to correspond to a first rising part which is an uppermost one of the plurality of rising parts and a second contact electrically connected to a first conductive layer of the plurality of conductive layers, which is adjacent to the uppermost conductive layer and is provided to correspond to a second rising part positioned on a lower layer side of the first rising part, the first conductive layer has a first thickness within the memory region and a second thickness larger than the first thickness within the stairs region near a position in which the second contact is disposed, thereby forming one terrace part of the plurality of terrace parts, the uppermost conductive layer has a third thickness within the memory region and a fourth thickness within the stairs region near a position in which the first contact is disposed, and a difference between the second thickness and the first thickness is larger than a difference between the fourth thickness and the third thickness.

15. The device of claim 14, wherein
as viewed from the first direction, a distance between the first rising part and the first contact is shorter than a distance between the first rising part and the second rising part.

16. The device of claim 14, wherein
the first contact is further electrically connected to the first conductive layer.

17. The device of claim 14, wherein
the first contact does not extend to the first conductive layer in the first direction.

18. The device of claim 14, wherein
the plurality of contacts further include a third contact electrically connected to a second conductive layer of the plurality of conductive layers provided to correspond to a third rising part positioned on a lower layer side of the second rising part, the second conductive layer has a fifth thickness within the memory region and a sixth thickness larger than the fifth thickness within the stairs region near a position in which the third contact is disposed, and a difference between the sixth thickness and the fifth thickness is larger than the difference between the fourth thickness and the third thickness.

19. The device of claim 18, wherein
the uppermost conductive layer and the first conductive layer of the plurality of conductive layers function as select gate lines for a NAND string, and the second conductive layer of the plurality of conductive layers functions as a word line for the NAND string.

20. The device of claim 14, wherein
the stacked layer body includes a structure in which the plurality of conductive layers and a plurality of insulating layers are stacked alternately in the first direction.

* * * * *